US008017503B2

(12) United States Patent
Oi et al.

(10) Patent No.: US 8,017,503 B2
(45) Date of Patent: Sep. 13, 2011

(54) MANUFACTURING METHOD OF SEMICONDUCTOR PACKAGE

(75) Inventors: Kiyoshi Oi, Nagano (JP); Toru Hizume, Nagano (JP); Fumimasa Katagiri, Tempe, AZ (US); Akihiko Tateiwa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 12/890,871

(22) Filed: Sep. 27, 2010

(65) Prior Publication Data

US 2011/0104886 A1 May 5, 2011

(30) Foreign Application Priority Data

Nov. 4, 2009 (JP) ................................ 2009-253434

(51) Int. Cl.
*H01L 21/00* (2006.01)

(52) U.S. Cl. ......... 438/462; 438/106; 257/620; 257/778

(58) Field of Classification Search .................. 438/106, 438/462; 257/620, 778
See application file for complete search history.

(56) References Cited

U.S. PATENT DOCUMENTS

| | | | | |
|---|---|---|---|---|
| 6,591,491 | B2 * | 7/2003 | Fujii et al. | 29/830 |
| 6,794,273 | B2 * | 9/2004 | Saito et al. | 438/462 |
| 6,861,757 | B2 * | 3/2005 | Shimoto et al. | 257/773 |
| 7,417,304 | B2 * | 8/2008 | Tsutsue | 257/620 |
| 7,531,381 | B2 * | 5/2009 | Pan et al. | 438/106 |
| 2009/0001604 | A1 * | 1/2009 | Tanaka et al. | 257/778 |

FOREIGN PATENT DOCUMENTS

| | | | |
|---|---|---|---|
| WO | WO02/15266 | A2 | 2/2002 |
| WO | WO02/33751 | A2 | 4/2002 |

* cited by examiner

*Primary Examiner* — Jarrett Stark
*Assistant Examiner* — Nicholas Tobergte
(74) *Attorney, Agent, or Firm* — IPUSA, PLLC

(57) ABSTRACT

A manufacturing method includes forming a semi-cured insulation layer made of a photosensitive material on a supporting body; forming an opening part in the insulation layer by a photolithography method, the opening part being configured to expose the supporting body; arranging a semiconductor chip on the insulation layer so that a position of an electrode of the semiconductor chip is consistent with a position of the opening part, and curing the insulation layer; forming sealing resin on a surface of the insulation layer at the semiconductor chip side, the sealing resin being configured to seal the semiconductor chip; removing the supporting body; and providing a wiring layer on a surface of the insulation layer opposite to the semiconductor chip side, the wiring layer being electrically connected to the electrode exposed in the opening part, so that a wiring structural body including the insulation layer and the wiring layer is formed.

10 Claims, 24 Drawing Sheets

MANUFACTURING METHOD OF SEMICONDUCTOR PACKAGE

CROSS-REFERENCE TO RELATED APPLICATIONS

This patent application is based upon and claims the benefit of priority of Japanese Patent Application No. 2009-253434 filed on Nov. 4, 2009, the entire contents of which are incorporated herein by reference.

BACKGROUND OF THE INVENTION

1. Field of the Invention

The present invention generally relates to manufacturing methods of semiconductor packages. More specifically, the present invention relates to a manufacturing method of a semiconductor package, the semiconductor package having a semiconductor chip and a wiring structural body electrically connected to the semiconductor chip.

2. Description of the Related Art

Conventionally, a semiconductor package where a semiconductor chip is mounted on a multi-layer wiring board via a solder bump or the like has been known. An example of a related art semiconductor package is discussed with reference to FIG. 1 through FIG. 3.

FIG. 1 is a cross-sectional view of an example of a related art semiconductor package. As illustrated in FIG. 1, a semiconductor package 100 has a structure where a semiconductor chip 200 is mounted on a substantially center part of a multi-layer wiring board 300 via bumps 400 and is sealed by underfill resin 500. Voids 700 are generated in the underfill resin 500.

The semiconductor chip 200 includes a semiconductor substrate 210 and electrode pads 220. The semiconductor substrate 210 has a structure where a semiconductor integrated circuit (not illustrated in FIG. 1) is formed on a substrate made of, for example, silicon (Si) or the like. The electrode pads 220 are formed at one side of the semiconductor substrate 210 and electrically connected to the semiconductor integrated circuit (not illustrated in FIG. 1).

The multi-layer wiring board 300 has a structure where a first wiring layer 310, a first insulation layer 340, a second wiring layer 320, a second insulation layer 350, a third wiring layer 330, and a solder resist layer 360 are stacked in order. The first wiring layer 310 and the second wiring layer 320 are electrically connected to each other via first via holes 340*x* provided in the first insulation layer 340. The second wiring layer 320 and the third wiring layer 330 are electrically connected to each other via second via holes 350*x* provided in the second insulation layer 350. External connection terminals 370 are formed on the third wiring layer 330 exposed in opening parts 360*x* of the solder resist layer 360. The first wiring layer 310 works as electrode pads to be connected to the electrode pads 220 of the semiconductor chip 200. The external connection terminals 370 work as terminals to be connected to a motherboard or the like.

The first wiring layer 310 of the multi-layer wiring board 300 and the electrode pads 220 of the semiconductor chip 200 are electrically connected to each other via the solder bumps 400. The underfill resin 500 is supplied between surfaces of the semiconductor chip 200 and the multi-layer wiring board 300 facing each other.

Next, a manufacturing method of the related art semiconductor package is discussed with reference to FIG. 2 and FIG. 3. FIG. 2 is a first view showing an example of a manufacturing process of the related art semiconductor package 100.

FIG. 3 is a second view showing the example of the manufacturing process of the related art semiconductor package. In FIG. 2 and FIG. 3, parts that are the same as the parts illustrated in FIG. 1 are given the same reference numerals, and explanation thereof is omitted.

First, in a step illustrated in FIG. 2, the semiconductor chip 200 and the multi-layer wiring board 300 manufactured by a known method are prepared. Then, pre-solder 410 is formed on the electrode pads 220 of the semiconductor chip 200. In addition, pre-solder 420 is formed on the first wiring layer 310 of the multi-layer wiring board 300 and flux 600 is applied so as to cover the pre-solder 420. The semiconductor chip 200 has a designated small thickness such as approximately 300 μm.

Next, in a step illustrated in FIG. 3, the first wiring layer 310 side of the multi-layer wiring board 300 and the electrode pads 220 side of the semiconductor chip 200 are made to face each other so that positions of the pre-solder 410 and positions of the pre-solder 420 correspond to each other. In addition, the pre-solder 410 and the pre-solder 420 are heated at, for example, approximately 230° C. so that solders are made molten and the solder bumps 400 are formed. In addition, the flux 600 is removed. The flux 600 may not be completely removed by cleaning so that residual 600A may remain.

Next, in a structural body illustrated at a lower side of FIG. 3, by supplying the underfill resin 500 between the surfaces of the semiconductor chip 200 and the multi-layer wiring board 300 facing each other, the semiconductor package 100 illustrated in FIG. 1 is completed. In this case, since a distance between the surfaces of the semiconductor chip 200 and the multi-layer wiring board 300 facing each other is short such as approximately 50 μm, it may be difficult for a liquid underfill material to flow and therefore the voids 700 may be generated. See International Patent Application Publication Official Gazette No. 02/15266 and International Patent Application Publication Official Gazette No. 02/33751.

However, while the coefficient of thermal expansion of the semiconductor chip 200 is, for example, approximately 3 ppm/° C., the coefficient of thermal expansion of the multi-layer wiring board 300 is, for example, approximately several tens ppm/° C. When the pre-solder 410 and the pre-solder 420 are heated in a step illustrated in FIG. 3, due to such a difference of the coefficients of thermal expansion between the semiconductor chip 200 and the multi-layer wiring board 300, while the semiconductor chip 200 may not be deformed, the multi-layer wiring board 30 may be warped in a convex or undulated manner. Because of this, a position shift between the semiconductor chip 200 and the multi-layer wiring board 300 may be generated so that connecting reliability between the semiconductor chip 200 and the multi-layer wiring board 300 may be degraded.

In addition, in the step illustrated in FIG. 3, if the residual 600A of the flux 600 remains, insulation failure may be generated, so that the connecting reliability between the semiconductor chip 200 and the multi-layer wiring board 300 may be degraded.

In addition, in a case where the distance between the surfaces of the semiconductor chip 200 and the multi-layer wiring board 300 facing each other is short, it is difficult for the liquid underfill material to flow so that the voids 700 may be generated.

SUMMARY OF THE INVENTION

Accordingly, embodiments of the present invention may provide a novel and useful manufacturing method of a semiconductor package solving one or more of the problems discussed above.

More specifically, the embodiments of the present invention may provide a manufacturing method of a semiconductor package whereby connecting reliability between a semiconductor chip and a wiring structural body is high and generation of voids can be reduced.

Another aspect of the embodiments of the present invention may be to provide a manufacturing method of a semiconductor package, including a first step of forming a semi-cured insulation layer made of a photosensitive material; a second step of forming an opening part in the insulation layer by a photolithography method, the opening part being configured to expose a supporting body; a third step of arranging a semiconductor chip on the insulation layer so that a position of an electrode of the semiconductor chip is consistent with a position of the opening part and curing the insulation layer; a fourth step of forming sealing resin on a surface of the insulation layer at the semiconductor chip side, the sealing resin being configured to seal the semiconductor chip; a fifth step of removing the supporting body; and a sixth step of providing a wiring layer on a surface of the insulation layer opposite to a surface at the semiconductor chip side, the wiring layer being electrically connected to the electrode exposed in the opening part, so that a wiring structural body including the insulation layer and the wiring layer is formed.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 4 through FIG. 24 of embodiments of the present invention.

First Embodiment

Structure of a Semiconductor Package of the First Embodiment

Figure 4:
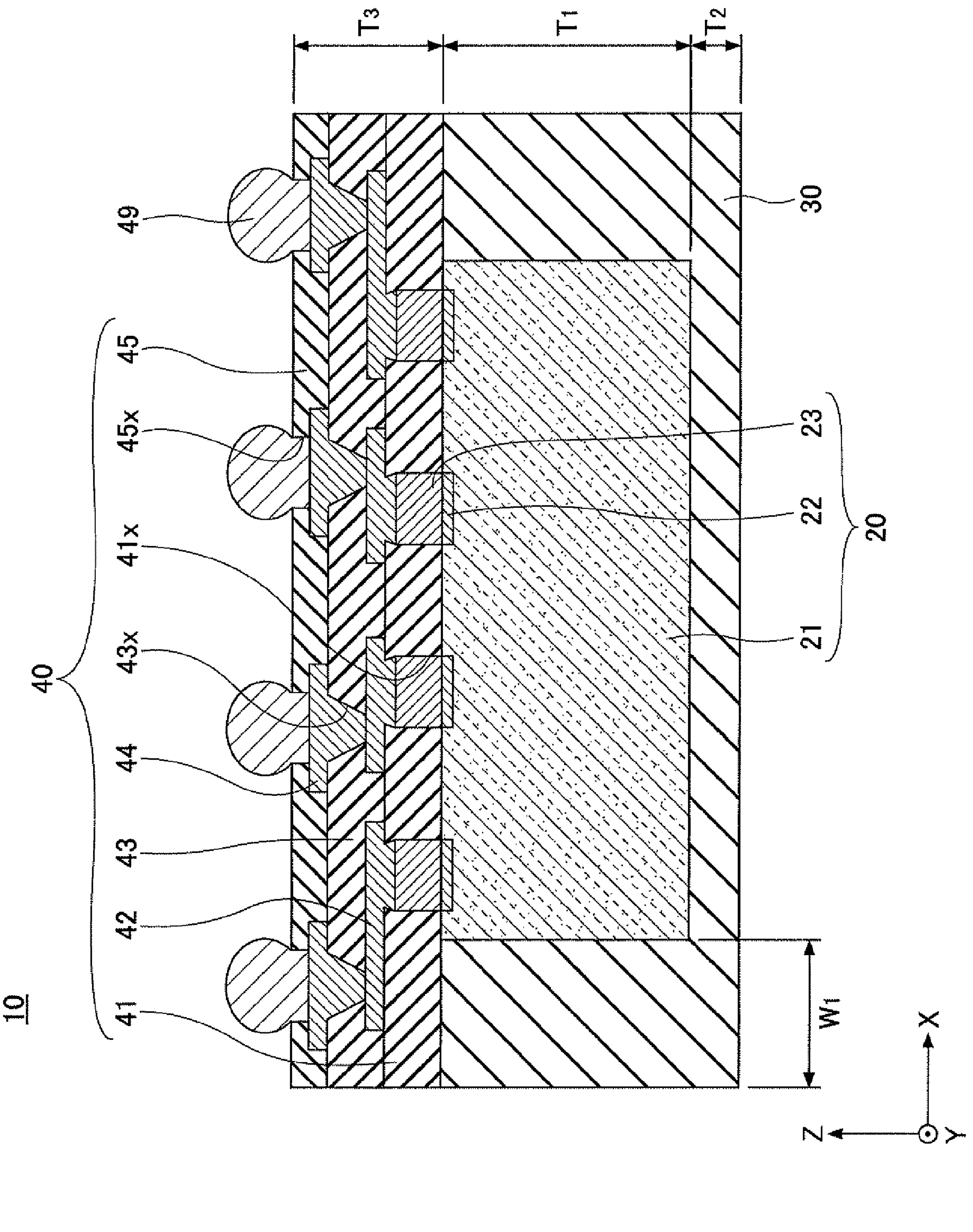
FIG. 4 is a cross-sectional view of an example of a semiconductor package of a first embodiment of the present invention.

FIG. 4 is a cross-sectional view of an example of a semiconductor package of a first embodiment of the present invention. As illustrated in FIG. 4, a semiconductor package 10 has a structure where a wiring structural body 40 is formed on a surface formed by a semiconductor chip 20 and sealing resin 30 and external connection terminals 49 are formed on the wiring structural body 40. The semiconductor package 10 has a plane plate-shaped configuration. A configuration of the semiconductor package 10 seen in a planar (two-dimensional) manner is a rectangular shape. Dimensions of the semiconductor package 10 are, for example, approximately 40 mm width (X direction)×approximately 40 mm depth (Y direction)×approximately 1 mm thickness (Z direction)

Figure 1:
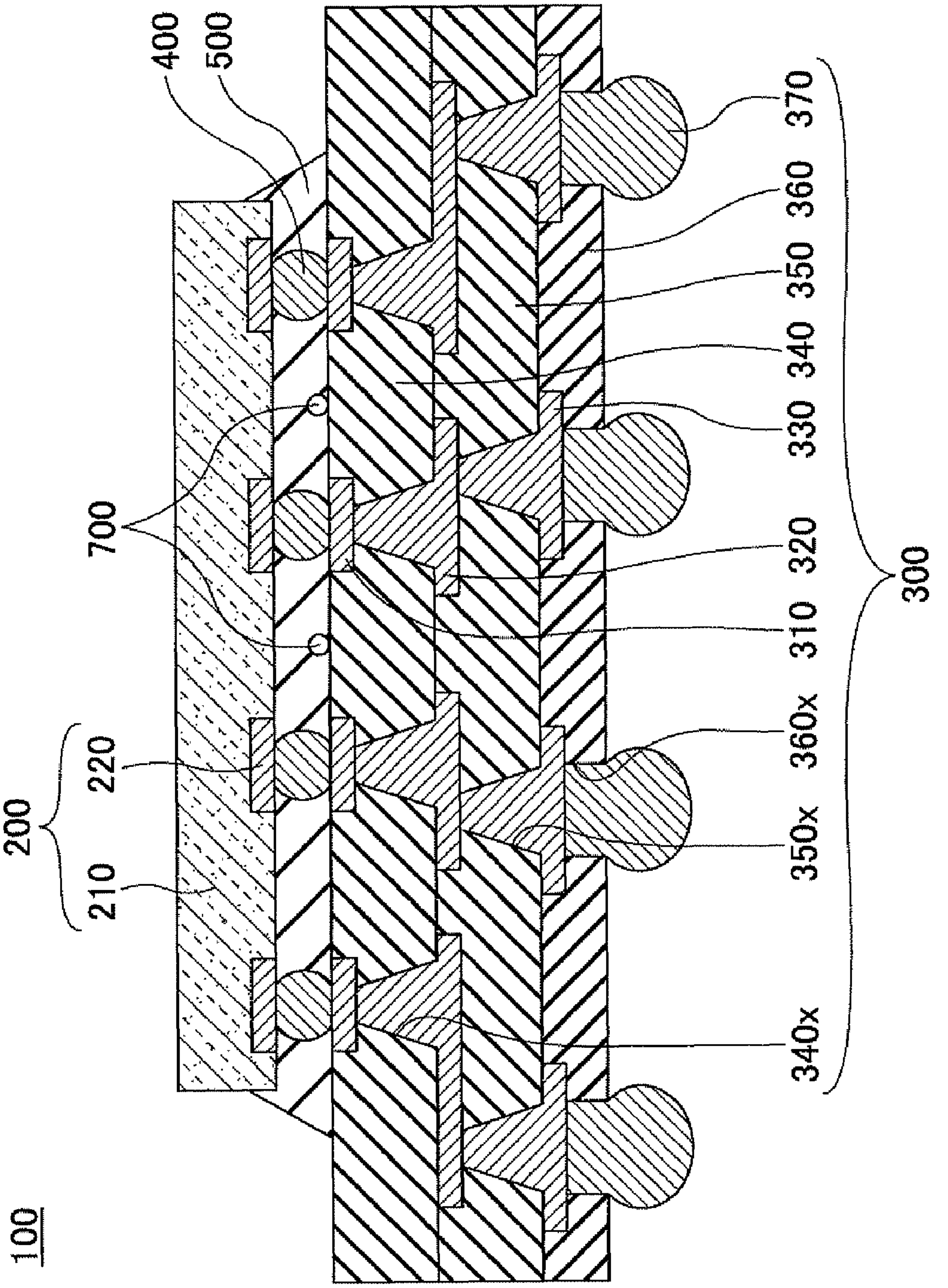
FIG. 1 is a cross-sectional view of an example of a related art semiconductor package.
Figure 2:
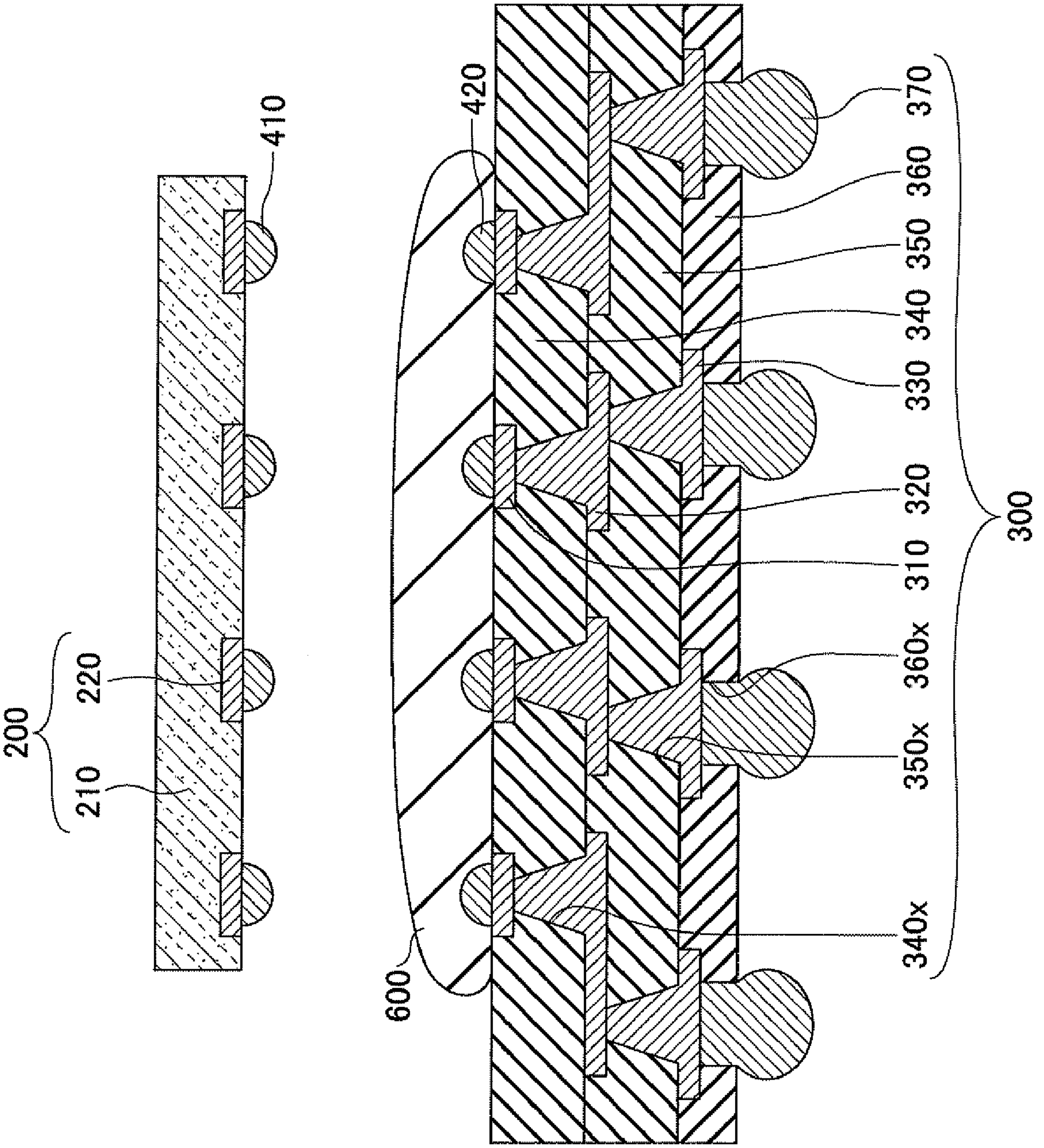
FIG. 2 is a first view showing an example of a manufacturing process of the related art semiconductor package.
Figure 3:
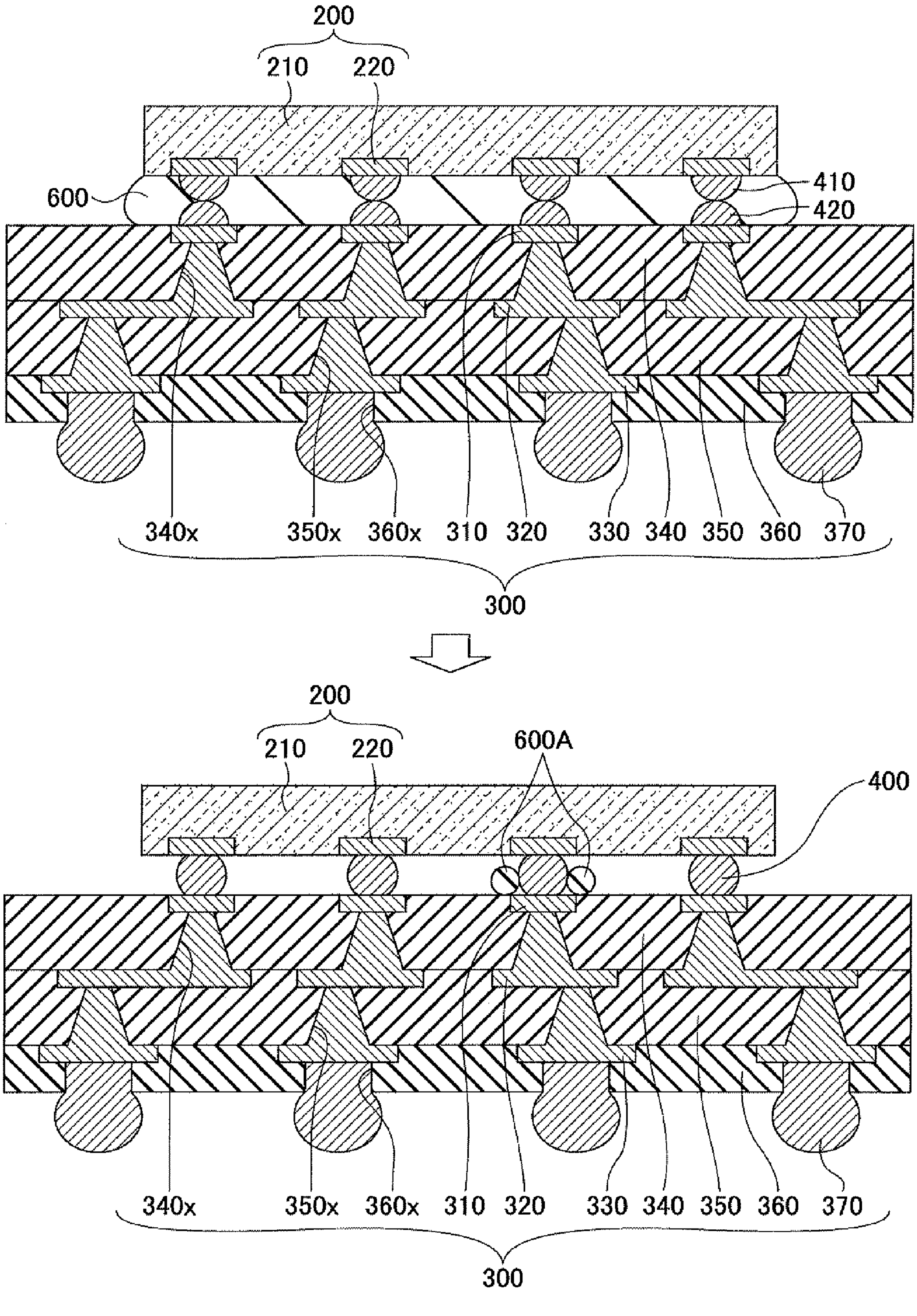
FIG. 3 is a second view showing the example of the manufacturing process of the related art semiconductor package.

The related art semiconductor package 100 illustrated in FIG. 1 has a structure where the semiconductor chip 200 is mounted on the multi-layer wiring board 300 which is a base body. On the other hand, in the semiconductor package 10 illustrated in FIG. 4, the wiring structural body 40 is mounted on the semiconductor chip 20 and the sealing resin 30 which are base bodies. In addition, in the related art semiconductor package 100 illustrated in FIG. 1, the semiconductor chip 200 and the multi-layer wiring board 300 are electrically connected to each other by using the solder bumps 400. On the other hand, in the semiconductor package 10 illustrated in FIG. 4, the bumps are not used for electric connection between the semiconductor chip 20 and the wiring structural body 40. In the following explanation, details of the semiconductor chip 20, the sealing resin 30, the wiring structural body 40, and the external connection terminals 49 forming the semiconductor package 10 are discussed.

The semiconductor chip 20 includes a semiconductor substrate 21, electrode pads 22, and projecting electrodes 23. The semiconductor substrate 21 has a structure where a semiconductor integrated circuit (not illustrated in FIG. 4) is formed on a substrate made of, for example, silicon (Si) or germanium (Ge). The electrode pads 22 are formed on one side of the semiconductor substrate 21 so as to be electrically connected to the semiconductor integrated circuit (not illustrated in FIG. 4). For example, aluminum (Al) or the like can be used as a material of the electrode pads 22. As the material of the electrode pads 22, a material where copper (Cu) and aluminum (Al) are stacked in this order, a material where copper (Cu), aluminum (Al), and silicon (Si) are stacked in this order, or the like may be used.

The projecting electrodes 23 are formed on the electrode pads 22. As the projecting electrode 23, for example, a columnar shaped copper (Cu) post or the like can be used. The diameter of the projecting electrode 23 can be, for example, approximately 25 μm through approximately 30 μm. The height of the projecting electrode 23 can be, for example, approximately 5 μm through approximately 10 μm. The pitch of neighboring projecting electrodes 23 can be, for example, approximately 50 μm through approximately 100 μm. In the following explanation, a surface of the semiconductor chip 20 at a side where the electrode pads 22 are formed may be called a main surface. A surface of the semiconductor chip 20 positioned opposite to the main surface and parallel with the main surface may be called a rear surface. A surface of the semiconductor chip 20 substantially perpendicular to the main surface and the rear surface may be called a side surface.

The sealing resin 30 is configured to seal the rear surface and the side surfaces of the semiconductor chip 20. One of the surfaces (a surface at the electrode pads 22 side) of the sealing resin 30 is substantially flush with the main surface of the semiconductor chip 20. As a material of the sealing resin 30, for example, epoxy group resin, polyimide group resin, or the like can be used. The width $W_1$ of a portion of the sealing resin 30 sealing the side surface of the semiconductor chip 20 can be, for example, approximately 300 μm through approximately 1000 μm. The thickness $T_1$ of the semiconductor chip 20 can be, for example, approximately 100 μm through approximately 800 μm. The thickness $T_2$ of a portion of the sealing resin 30 sealing the rear surface of the semiconductor chip 20 can be, for example, approximately 200 μm through approximately 1000 μm.

The wiring structural body 40 has a structure where a first insulation layer 41, a first wiring layer 42, a second insulation layer 43, a second wiring layer 44, and a solder resist layer 45 are stacked in order. The thickness $T_3$ of the wiring structural body 40 can be, for example, approximately 50 μm through approximately 100 μm.

Thus, the thickness $T_3$ of the wiring structural body 40 is thinner than the thickness $T_1$ of the semiconductor chip 20 or a sum of the thickness $T_1$ of the semiconductor chip 20 and the thickness $T_2$ of a portion of the sealing resin 30.

The first insulation layer 41 is formed on the main surface of the semiconductor chip 20 and one of surfaces of the sealing resin 30 so as to cover the projecting electrodes 23 of the semiconductor chip 20. As a material of the first insulation layer 41, for example, epoxy group resin, polyimide group resin, or the like can be used. The thickness of the first insulation layer 41 can be, for example, approximately 5 μm through approximately 10 μm. The thickness of the first insulation layer 41 may be equal to or greater than the thickness of the projecting electrodes 23. In the case where the thickness of the first insulation layer 41 is greater than the thickness of the projecting electrodes 23, as illustrated in FIG. 4, concave parts are formed at the projecting electrodes 23 of the first insulation layer 41 and the first wiring layer 42 is formed in the concave parts.

The first wiring layer 42 is formed on the first insulation layer 41. The first wiring layer 42 is electrically connected to the projecting electrodes 23 exposed through the first insulation layer 41. As a material of the first wiring layer 42, for example, copper (Cu) or the like can be used. The thickness of wiring patterns formed in the first wiring layer 42 can be, for example, approximately 5 μm. Thus, in the semiconductor package 10 of the first embodiment of the present invention, a bump such as a solder bump is not used for electric connection between the semiconductor chip 20 and the wiring structural body 40.

The second insulation layer 43 is formed on the first insulation layer 41 so as to cover the first wiring layer 42. As a material of the second insulation layer 43, for example, epoxy group resin, polyimide group resin, or the like can be used. The thickness of the second insulation layer 43 can be, for example, approximately 20 μm through approximately 30 μm.

The second wiring layer 44 is formed on the second insulation layer 43. The second wiring layer 44 includes via plugs and wiring patterns formed on the second insulation layer 44. The via plugs are supplied in the via holes 43$x$ which pierce the second insulation layer 43 so as to expose an upper surface of the first wiring layer 42. The second wiring layer 44 is electrically connected to the first wiring layer 42 exposed in the via holes 43$x$. As a material of the second wiring layer 44, for example, copper (Cu) or the like can be used. The thickness of wiring patterns formed in the second wiring layer 44 can be, for example, approximately 5 μm.

The solder resist layer 45 is formed on the second insulation layer 43 so as to cover the second wiring layer 44. The solder resist layer 45 includes opening parts 45$x$. Parts of the second wiring layer 44 are exposed in the opening parts 45$x$ of the solder resist layer 45. As a material of the solder resist layer 45, for example, epoxy group resin, imide group resin, or the like can be used. The thickness of the solder resist layer 45 can be, for example, approximately 20 μm through approximately 30 μm.

If necessary, a metal layer or the like may be formed on the second wiring layer 44 exposed in the opening parts 45$x$. The metal layer may be, for example, an Au layer, a Ni/Au layer where Ni and Au are stacked in this order, or a Ni/Pd/Au layer where Ni, Pd, and Au are stacked in this order.

The external connection terminals 49 are formed on the second wiring layer 44 exposed in the opening parts 45$x$ of the solder resist layer 45 forming the wiring structural body 40 (on a metal layer or the like in a case where the metal layer or the like is formed on the second wiring layer 44). In the first embodiment of the present invention, the semiconductor package 10 has a so-called a fan-out structure. In the fan-out structure, a region where the external connection terminals 49 are formed extends to the periphery of a region right above the semiconductor chip 20. The pitch of neighboring external connection terminals 49 can be increased so as to be grater than the pitch of neighboring projecting electrode 23 (for example, approximately 50 μm through approximately 100 μm). For example, the pitch of neighboring external connection terminals 49 can be, for example, approximately 300 μm through approximately 1000 μm. The semiconductor package 10, depending on the purpose, may have a fan-in structure.

The external connection terminals 49 work as terminals electrically connected to pads provided on a mounting board (not illustrated) such as a motherboard. As the external connection terminals 49, for example, solder balls or the like can be used. As a material of the solder balls, for example, an alloy including Pb, an alloy of Sn and Cu, an alloy of Sn and Ag, an alloy of Sn, Ag, and Cu, or the like can be used.

Although the external connection terminals 49 are formed in the first embodiment of the present invention, it is not always necessary to form the external connection terminals 49. In other words, it is sufficient that a part of the second wiring layer 44 be exposed through the solder resist layer 45 so that the external connection terminals 49 may be formed if necessary.

In the first embodiment of the present invention, the width $W_1$ of the sealing resin 30 is set to be, for example, approximately 300 μm through approximately 1000 μm. However, in a case where a semiconductor package having a large number of terminals is realized by the fan-out structure, the width $W_1$ of the sealing resin 30 may be approximately 1 mm through approximately 6 mm and a large number of the external connection terminals 49 may be provided above the sealing resin 30.

A structure discussed above is the structure of the semiconductor package 10 where the wiring structural body 40 is formed on a surface formed by the semiconductor element 20 and the sealing resin 30.

Manufacturing Method of the Semiconductor Package of the First Embodiment

Next, a manufacturing method of the semiconductor package of the first embodiment is discussed. FIG. 5 through FIG. 18 are first through fourteenth views showing an example of a manufacturing process of the semiconductor package of the first embodiment of the present invention. In FIG. 5 through FIG. 18, parts that are the same as the parts illustrated in FIG. 4 are given the same reference numerals, and explanation thereof is omitted.

Figure 5:
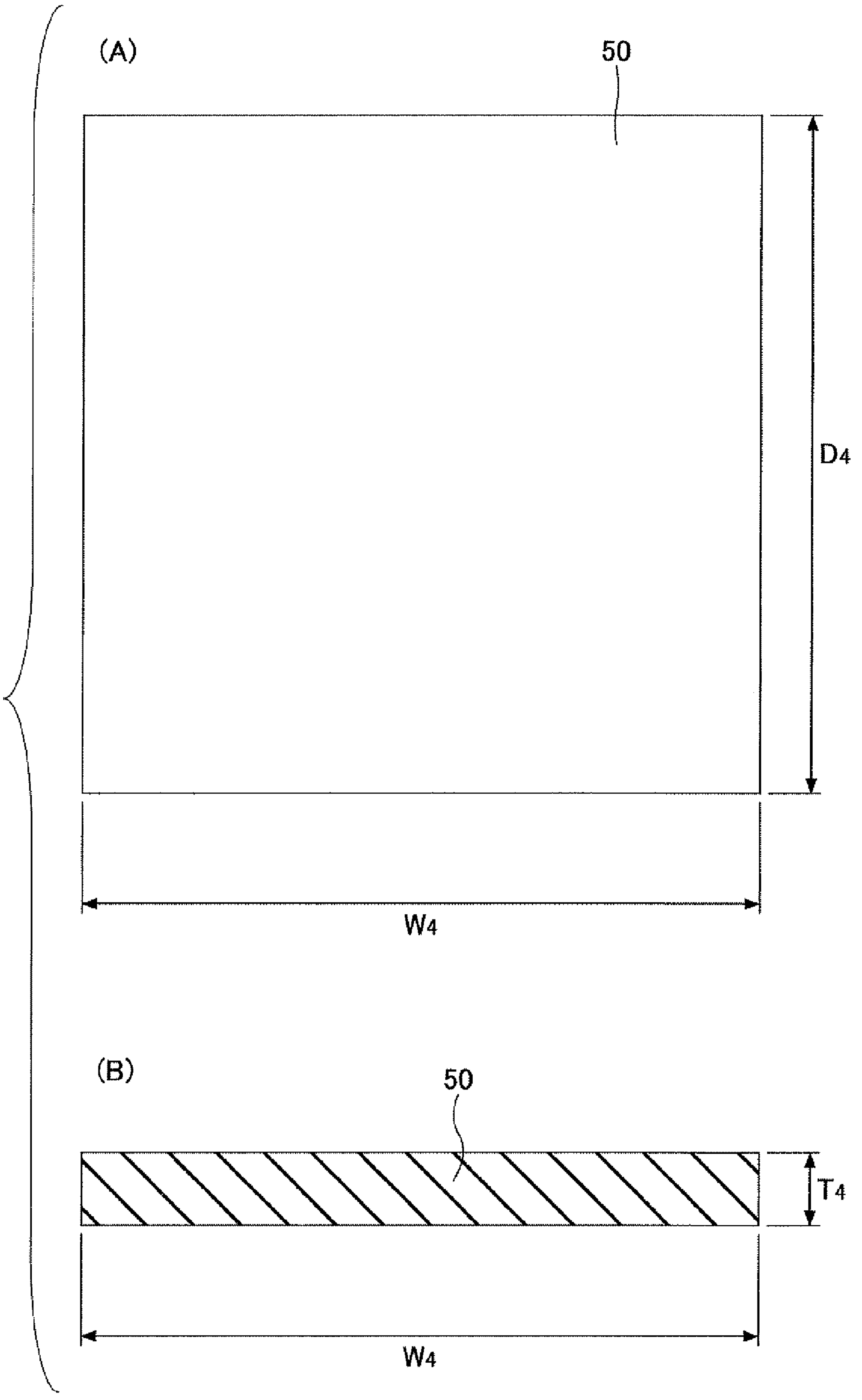
FIG. 5 is a first view showing an example of a manufacturing process of the semiconductor package of the first embodiment of the present invention.

First, in a step illustrated in FIG. 5, a supporting body 50 is prepared. FIG. 5(A) is a plan view and FIG. 5(B) is a cross-sectional view. As the supporting body 50, a plate made of, for example, copper (Cu), silicon (Si), ceramics, glass, or the like can be used. Each of the width $W_4$ and depth $D_4$ of the supporting body 50 can be, for example, approximately 200 mm. The thickness $T_4$ of the supporting body 50 may be approximately 0.2 mm through approximately 0.6 mm. In the first embodiment of the present invention, a copper plate having a rectangular-shaped configuration in a planar view is used as the supporting plate 50. However, the supporting plate 50 is not limited to this example; the supporting plate 50 may be a copper or silicon plate having a circular-shaped configuration in a planar view.

Figure 6:
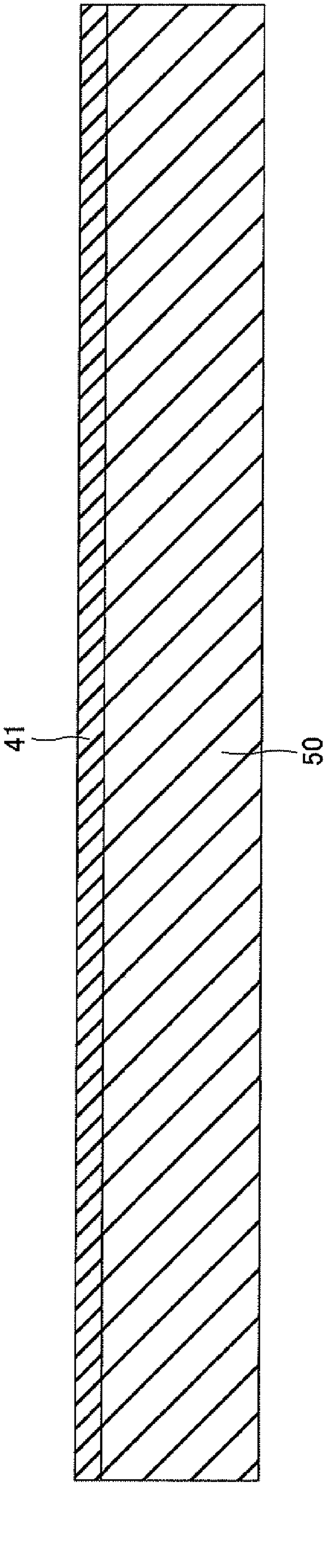
FIG. 6 is a second view showing the example of the manufacturing process of the semiconductor package of the first embodiment of the present invention.

Next, in a step illustrated in FIG. 6, the first insulation layer 41 is formed on one of the surfaces of the supporting body 50. The first insulation layer 41 may be applied by spin coating a paste or liquid resin material or laminating a resin film. In the case where the insulation layer 41 is applied by spin coating the paste or liquid resin material, the voids may not be generated. However, in the case where the resin film is laminated, the voids may be generated. Because of this, in the case where the resin film is used as the first insulation layer 41, the resin film may be laminated in a vacuum environment. By laminating the resin film in the vacuum environment, it is possible to prevent the voids from being formed in the first insulation layer 41.

As the material of the first insulation layer 41, for example, a paste, a liquid, or a film photosensitive and thermosetting resin material whose main ingredient is acrylic, epoxy, or polyimide can be used. The first insulation layer 41 can have the thickness of, for example, approximately 5 μm through approximately 10 μm. The first insulation layer 41 is not completely cured but is in a semi-cured state (B-state).

Figure 7:
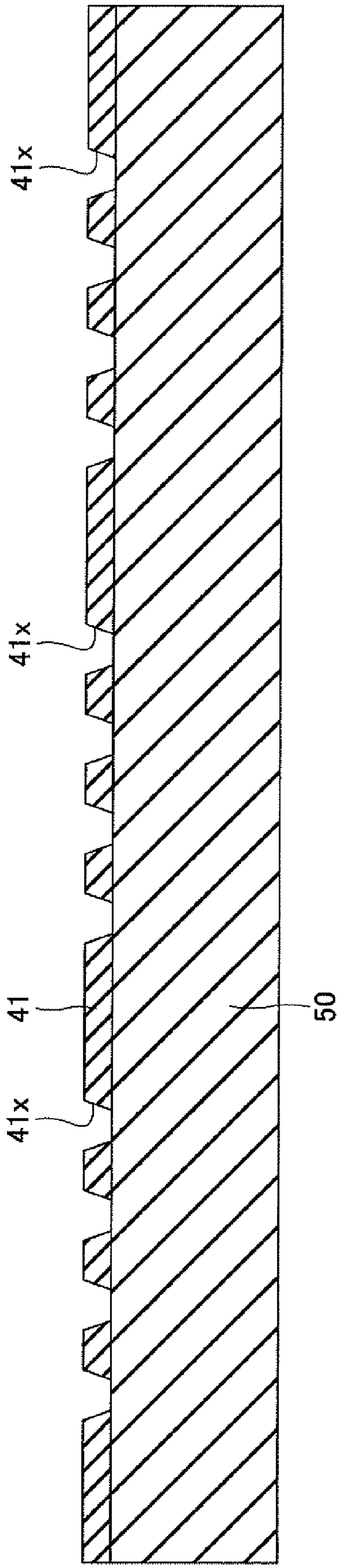
FIG. 7 is a third view showing the example of the manufacturing process of the semiconductor package of the first embodiment of the present invention.

Next, in a step illustrated in FIG. 7, opening parts 41*x* are formed in the first insulation layer 41 by photolithography so that one of the surfaces of the supporting body 50 is exposed. The positions of the opening parts 41*x* correspond to positions of the projecting electrodes 23 of the semiconductor chips 20 to be mounted in a step illustrated in FIG. 9. The opening part 41*x* has, for example, a cone frustum-shaped configuration where a diameter at the supporting body 50 side is small. By forming the opening part 41*x* in the first insulation layer 41 by photolithography, it is possible to form the opening parts 41*x* with high positional precision. The positional precision of the opening parts 41*x* can be, for example, equal to or less than ±10 μm relative to a designated position. Even in this step, the first insulation layer 41 remains in a not completely cured state but in a semi-cured state (B-stage state).

Figure 8:
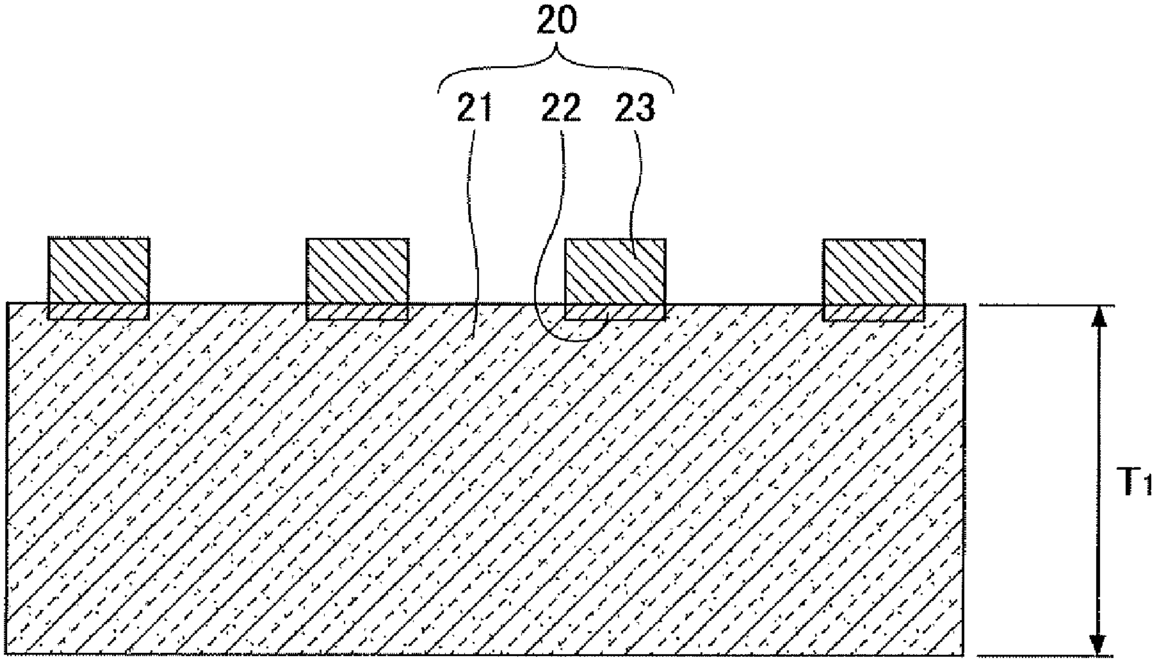
FIG. 8 is a fourth view showing the example of the manufacturing process of the semiconductor package of the first embodiment of the present invention.

Next, in a step illustrated in FIG. 8, a designated number of the semiconductor chips 20 having the electrode pads 22 and the projecting electrodes 23 are prepared. The semiconductor chip 20 may have a thickness $T_1$ of, for example, approximately 100 μm through approximately 800 μm.

Figure 9:
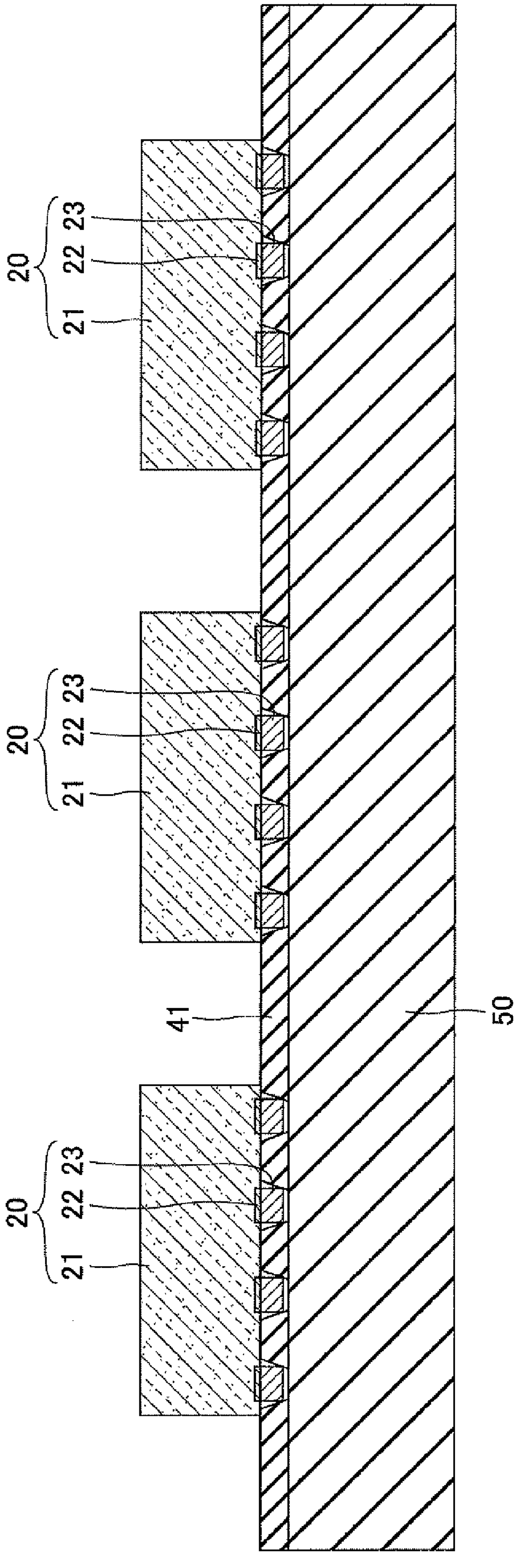
FIG. 9 is a fifth view showing the example of the manufacturing process of the semiconductor package of the first embodiment of the present invention.

Next, in a step illustrated in FIG. 9, the semiconductor chips 20 are mounted on the first insulation layer 41. More specifically, the opening parts 41*x* of the first insulation layer 41 and the respective projecting electrodes 23 of the semiconductor chips 20 are positioned to face each other. Then, the projecting electrodes 23 of the semiconductors chip 20 are inserted in the respective opening parts 41*x* of the first insulation layer 41 so that the semiconductor chips 20 are provided on the first insulation layer 41. By heating the first insulation layer at, for example, approximately 80° C., the semiconductor chips 20 are provisionally fixed onto the first insulation layer. Then, by heating the first insulation layer 41 at a curing temperature such as approximately 170° C., the first insulation layer 41 is completely cured. In this case, the projecting electrodes 23 may come in contact with the exposed surface of the supporting body 50. A space may be provided between the projecting electrodes 23 and the exposed surface of the supporting body 50. By this step, a main surface (active surface) of the semiconductor chip 20 is adhered to the exposed surface of the first insulation layer 41.

Figure 10:
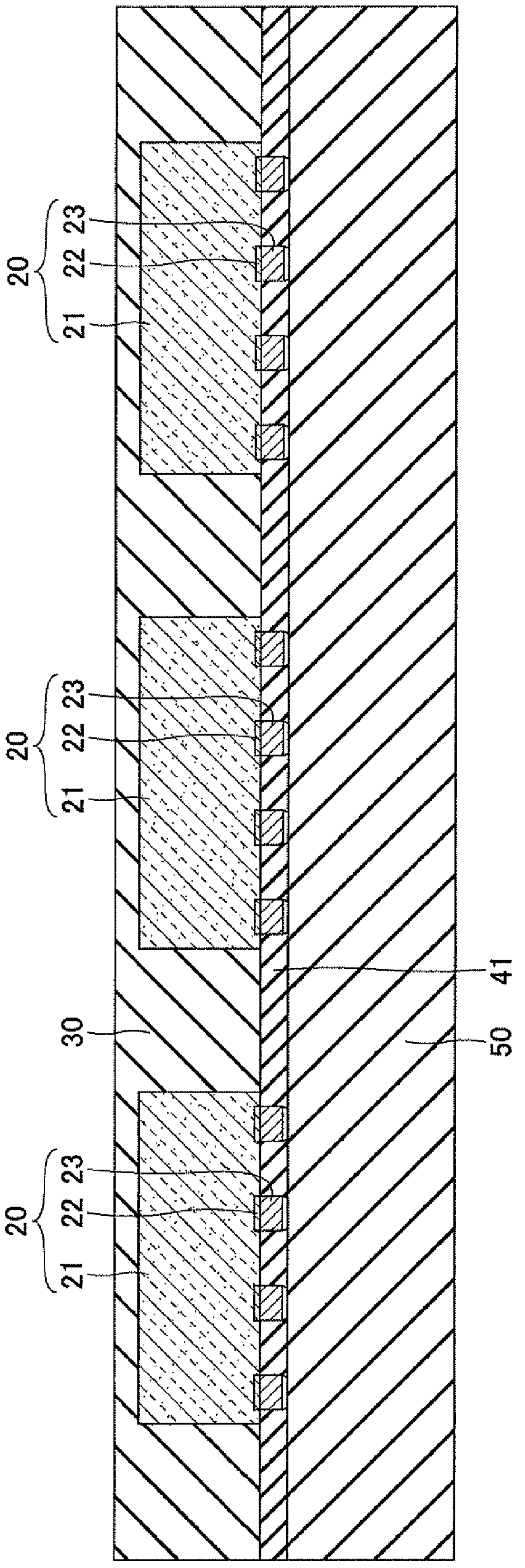
FIG. 10 is a sixth view showing the example of the manufacturing process of the semiconductor package of the first embodiment of the present invention.

Next, in a step illustrated in FIG. 10, the sealing resin 30 is formed on the first insulation layer 41 so as to cover the semiconductor chips 20. As a material of the sealing resin 30, for example, epoxy group resin, polyimide resin, or the like can be used. Since the sealing resin 30 is a part of a base body of the semiconductor package 10, a resin material having good hardness or strength rather than consistent thickness or processing easiness may be used. The sealing resin 30 can be formed by, for example, a transfer molding method. Since a space between the side surface of the projecting electrode 23 and an internal wall surface of the opening part 41x (see FIG. 9) is extremely small, the space is covered with the first insulation layer 41 which is softened by the process of heating the first insulation layer 41 at the temperature equal to or higher than the curing temperature of the first insulation layer 41 in the step illustrated in FIG. 9.

Figure 11:
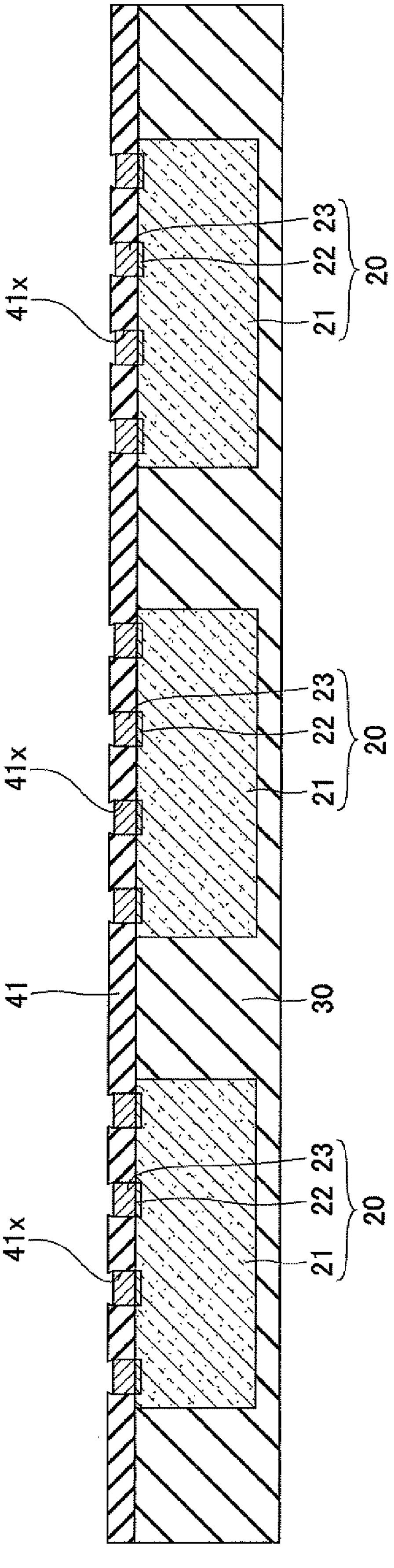
FIG. 11 is a seventh view showing the example of the manufacturing process of the semiconductor package of the first embodiment of the present invention.

Next, in a step illustrated in FIG. 11, the supporting body 50 illustrated in FIG. 10 is removed. FIG. 11 is an upside down view relative to FIG. 10. In a case where the supporting body 50 is a copper (Cu) plate, the supporting body 50 can be removed by etching using, for example, a ferric chloride aqueous solution. In a case where the supporting body 50 is a plate made of silicon, ceramics, glass, or the like, a pressure sensitive adhesive double coated tape is adhered on the exposed surface of the supporting body 50 so that the first insulation layer 41 may be formed on the surface of the supporting body 50 via the tape. Although the pressure sensitive adhesive double coated tape is a thermally foamed type tape which has adhesion at a normal temperature, the adhesion is decreased when the pressure sensitive adhesive double coated tape is heated so as to be easily peeled. In this case, the supporting body 50 can be removed by heating at a temperature where the adhesion of the pressure sensitive adhesive double coated tape is decreased.

Figure 12:
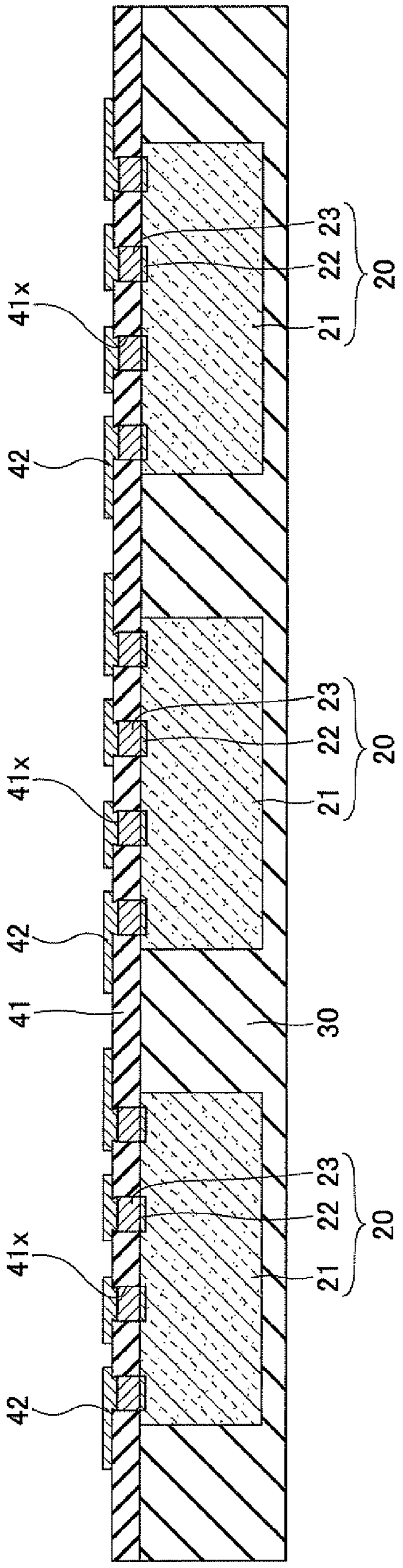
FIG. 12 is an eighth view showing the example of the manufacturing process of the semiconductor package of the first embodiment of the present invention.

Next, in a step illustrated in FIG. 12, the first wiring layer 42 is formed on the first insulation layer 41. The first wiring layer 42 is electrically connected to the projecting electrodes 23 exposed in the opening parts 41x. For example, copper (Cu) or the like can be used as a material of the first wiring layer 42. The first wiring layer 42 can be formed by various kinds of wiring forming methods such as a semi-additive method or a subtractive method. In the following, an example where the first wiring layer 42 is formed by the semi-additive method is discussed.

First, a seed layer (not illustrated in FIG. 12) is formed on upper surfaces of the projecting electrodes 23 exposed in the opening parts 41x and on the insulation layer 41 including internal wall surfaces of the opening parts 41x by an electroless plating method, a sputtering method or a vapor deposition method. The seed layer is made of nickel (Ni), titanium (Ti), copper (Cu), or the like. In addition, a resist layer (not illustrated in FIG. 12) having opening parts corresponding to the first wiring layer 42 is formed on the seed layer. Further, by an electrolytic plating method where the seed layer is used as a feeding layer, a wiring layer (not illustrated in FIG. 12) made of copper (Cu) or the like is formed in the opening parts of the resist layer. Then, after the resist layer is removed, a portion of the seed layer not covered with the wiring layer is etched where the wiring layer is used as a mask. Thus, the first wiring layer 42 is formed on the first insulation layer 41.

Figure 13:
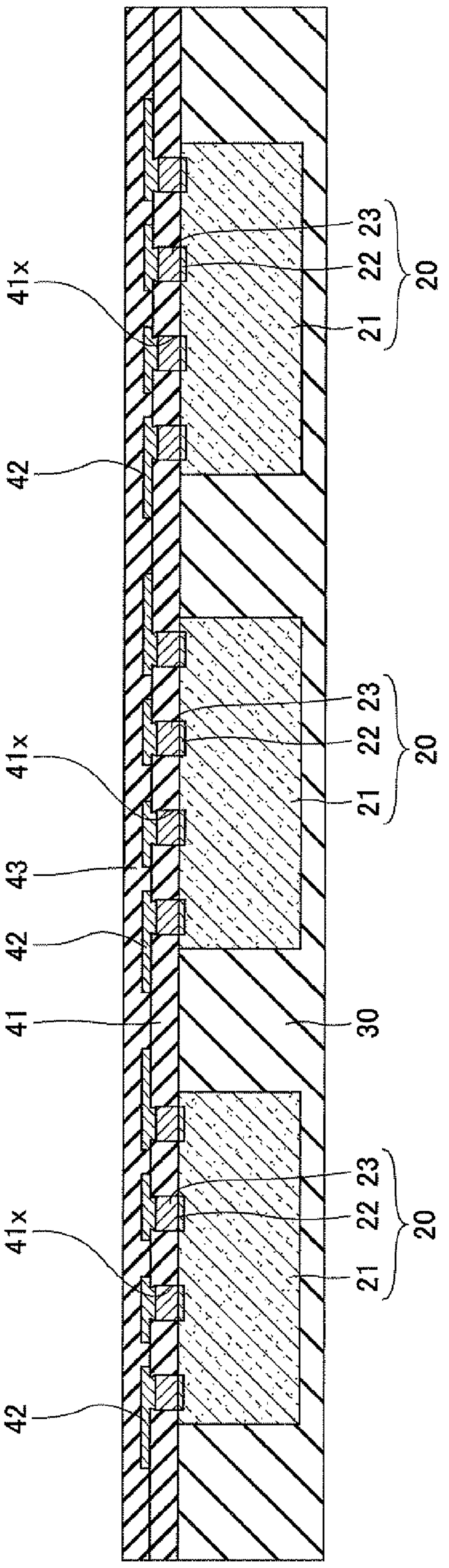
FIG. 13 is a ninth view showing the example of the manufacturing process of the semiconductor package of the first embodiment of the present invention.

Next, in a step illustrated in FIG. 13, the second insulation layer 43 is formed on the first insulation layer 41 so as to cover the first wiring layer 42. As a material of the second insulation material 43, for example, sheet, paste, or liquid epoxy group resin or polyimide group resin having thermosetting capabilities, or the like can be used. The second insulation layer 43 can have a thickness of, for example, approximately 20 μm through approximately 30 μm.

In the case where the sheet epoxy group resin or polyimide group resin having thermosetting capabilities is used as a material of the second insulation layer 43, the second insulation layer 43 is laminated on the first insulation layer 41 so as to cover the first wiring layer 42. After the laminated second insulation layer 43 is pressed, the second insulation layer 43 is heated at a temperature equal to or higher than the curing temperature so as to be cured. Laminating may be performed in a vacuum environment.

In addition, in the case where paste epoxy group resin or polyimide group resin having thermosetting capabilities is used as a material of the second insulation layer 43, the second insulation layer 43 is applied on the first insulation layer 41 so as to cover the first wiring layer 42. The applied second insulation layer 43 is heated at a temperature equal to or higher than the curing temperature so as to be cured.

Figure 14:
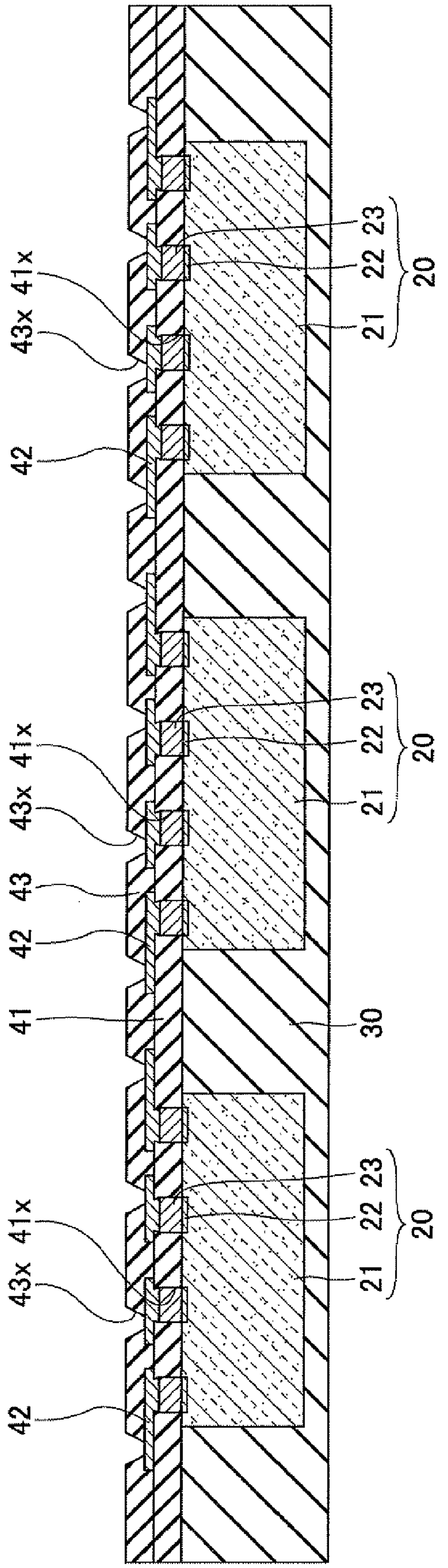
FIG. 14 is a tenth view showing the example of the manufacturing process of the semiconductor package of the first embodiment of the present invention.

Next, in a step illustrated in FIG. 14, via-holes 43x are formed in the second insulation layer 43 so as to pierce the second insulation layer 43 and expose an upper surface of the first wiring layer 42. The via-holes 43x can be formed by, for example, a laser processing method using $CO_2$ lasers. The via-holes 43x may be formed by using photosensitive resin as the second insulation layer 43 and patterning the second insulation layer 43 with photolithography. In addition, the via-holes 43x may be formed by printing paste resin via a screen mask whose masking positions correspond to the positions of the via-holes 43x and curing the paste resin.

Figure 15:
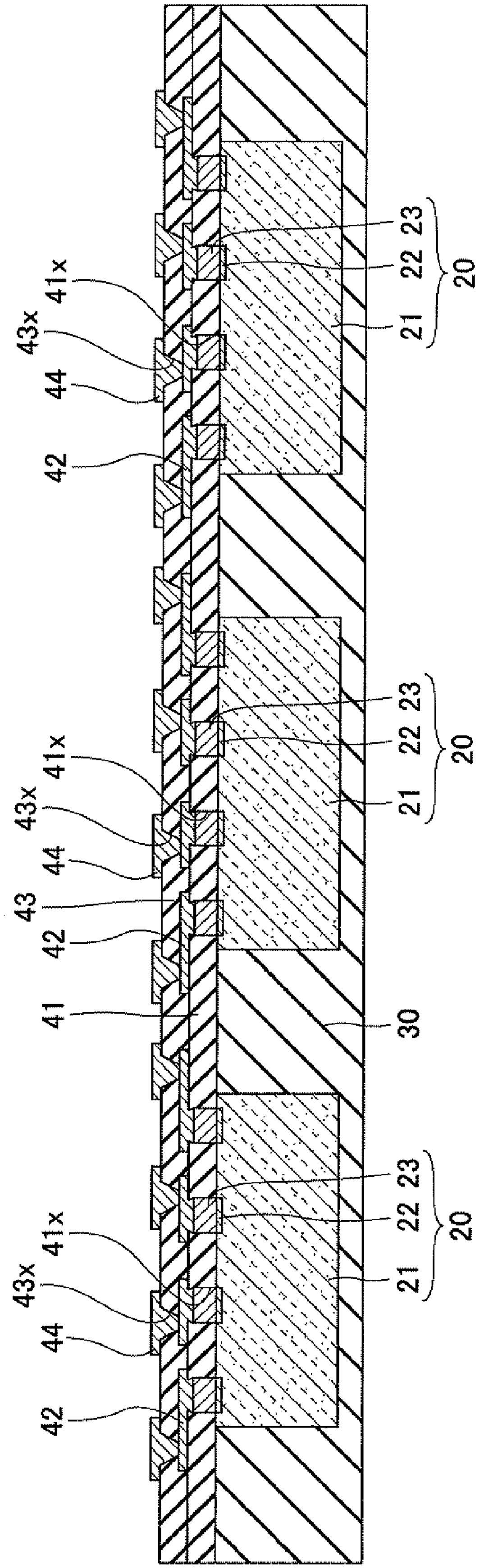
FIG. 15 is an eleventh view showing the example of the manufacturing process of the semiconductor package of the first embodiment of the present invention.

Next, in a step illustrated in FIG. 15, the second wiring layer 44 is formed on the second insulation layer 43. The second wiring layer 44 includes via-plugs which fill in the via-holes 43x and a wiring pattern formed on the second insulation layer 43. The second wiring layer 44 is electrically connected to the first wiring layer 42 exposed in the via-holes 43x. For example, copper (Cu) or the like can be used as a material of the second wiring layer 44. The second wiring layer 44 can be formed by various kinds of wiring forming methods such as the semi-additive method or the subtractive method.

In the steps illustrated in FIG. 12 through FIG. 15, a double-layer built-up wiring layer (the first wiring layer 42 and the second wiring layer 44) is formed on the first insulation layer 41. The built-up wiring layer may be a single layer. The built-up wiring layer may have n-layers (n is an integer equal to or greater than 3) by repeating the steps illustrated in FIG. 12 through FIG. 15 necessary times after the step illustrated in FIG. 15.

Figure 16:
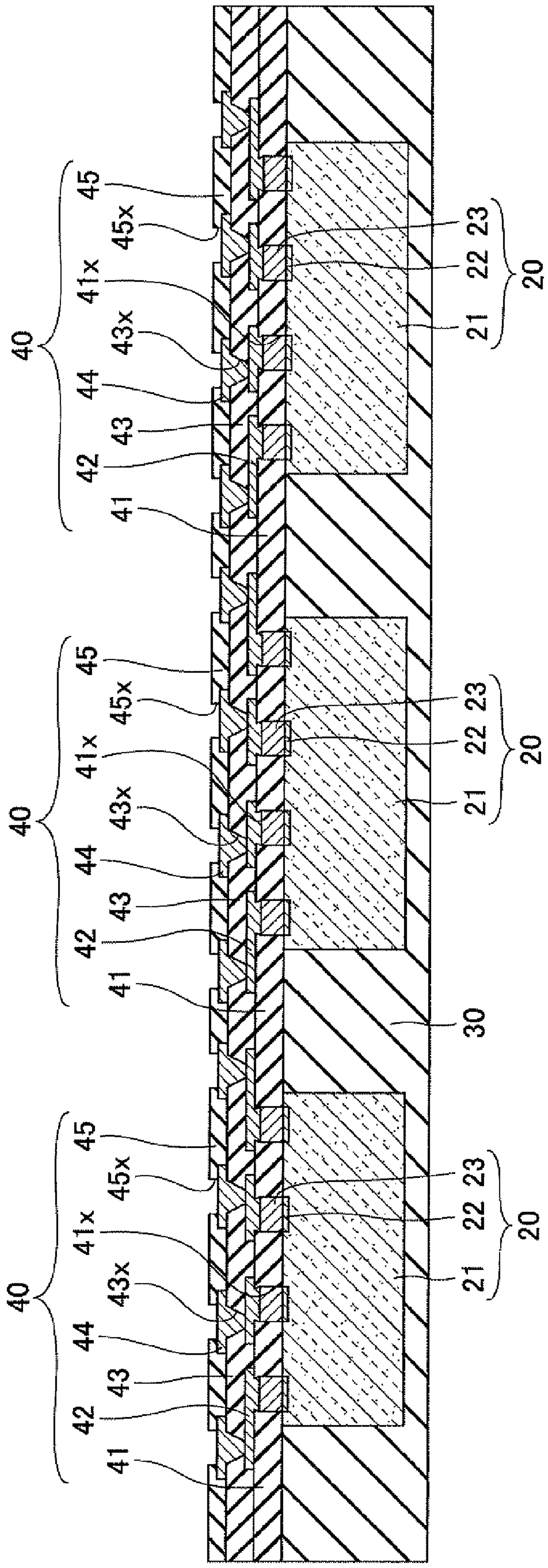
FIG. 16 is a twelfth view showing the example of the manufacturing process of the semiconductor package of the first embodiment of the present invention.

Next, in a step illustrated in FIG. 16, the solder resist layer 45 having opening parts 45x is formed on the second insulation layer 43 so as to cover the second wiring layer 44. More specifically, solder resist is applied on the second insulation layer 43 so as to cover the second wiring layer 44. The solder resist is made of, for example, a photosensitive resin composition including epoxy group resin, imide group resin, or the like. The applied solder resist is exposed and developed so that the opening parts 45x are formed. As a result of this, the solder resist layer 45 having the opening parts 45x is formed. A part of the second wiring layer 44 is exposed in the opening parts 45x of the solder resist layer 45. If necessary, a metal layer or the like may be formed on the second wiring layer 44. As a material of the metal layer, for example, Au or the like can be used. The metal layer may be, for example, a Ni/Au layer where Ni and Au are stacked, in this order, or a Ni/Pd/Au layer where Ni, Pd, and Au are stacked, in this order.

Figure 17:
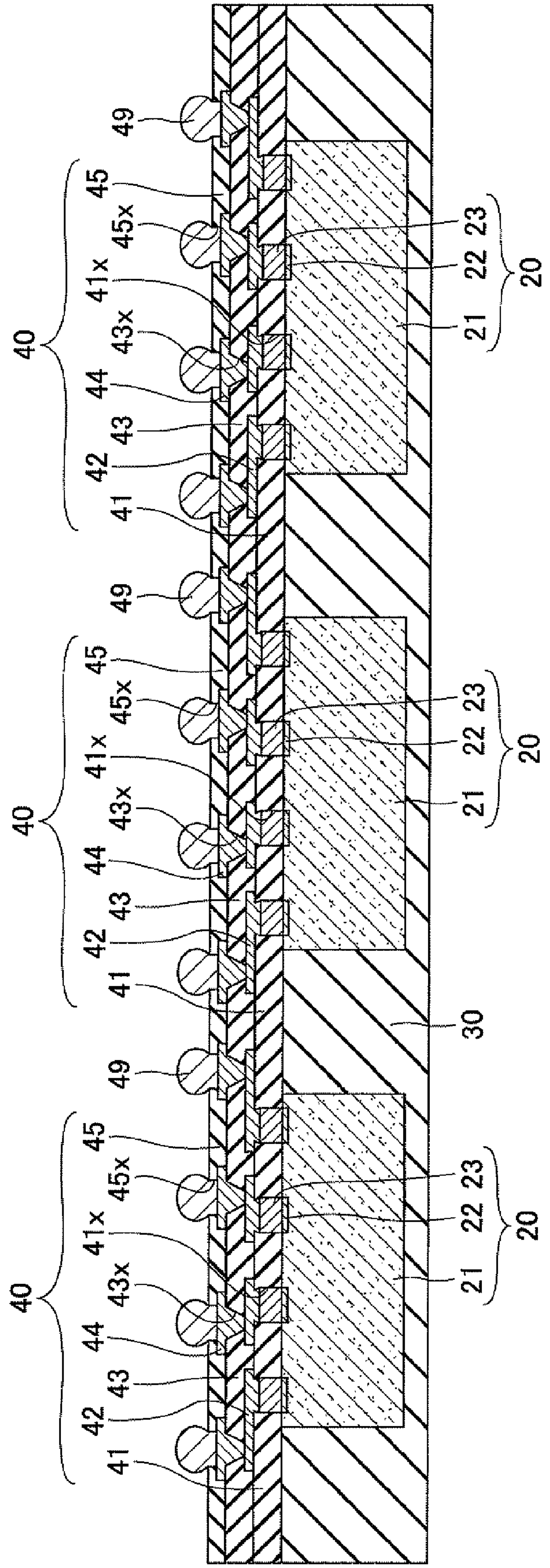
FIG. 17 is a thirteenth view showing the example of the manufacturing process of the semiconductor package of the first embodiment of the present invention.

Next, in a step illustrated in FIG. 17, external connection terminals 49 are formed on the second wiring layer 44 exposed in the opening parts 45x (the metal layer or the like in the case where the metal layer or the like is formed on the second wiring layer 44). In the first embodiment of the present invention, the semiconductor package 10 has a so-called a fan-out structure. In the fan-out structure, a region where the external connection terminals 49 are formed extends to the periphery of a region right above the semiconductor chip 20. The semiconductor package 10, depending on the purpose, may have a fan-in structure.

The external connection terminal 49 works as a terminal electrically connected to a pad provided on a mounting board (not illustrated) such as a motherboard. As the external connection terminal 49, for example, a solder ball or the like can be used. As a material of the solder ball, for example, an alloy including Pb, an alloy of Sn and Cu, an alloy of Sn and Ag, an alloy of Sn, Ag, and Cu, or the like can be used.

The external connection terminals 49 can be formed by the following method. For example, after a flux as a surface treatment agent is applied on the second wiring 44 (the metal layer or the like in the case where the metal layer or the like is formed on the second wiring layer 44), solder balls are provided, a reflow process is performed at approximately 240° C. through approximately 260° C., and then the surface is cleaned so that the flux is removed.

Although the external connection terminals 49 are formed in the first embodiment, it is not always necessary to form the external connection terminals 49. In other words, it is sufficient that a part of the second wiring layer 44 be exposed through the solder resist layer 45 so that the external connection terminals can be connected if necessary.

Figure 18:
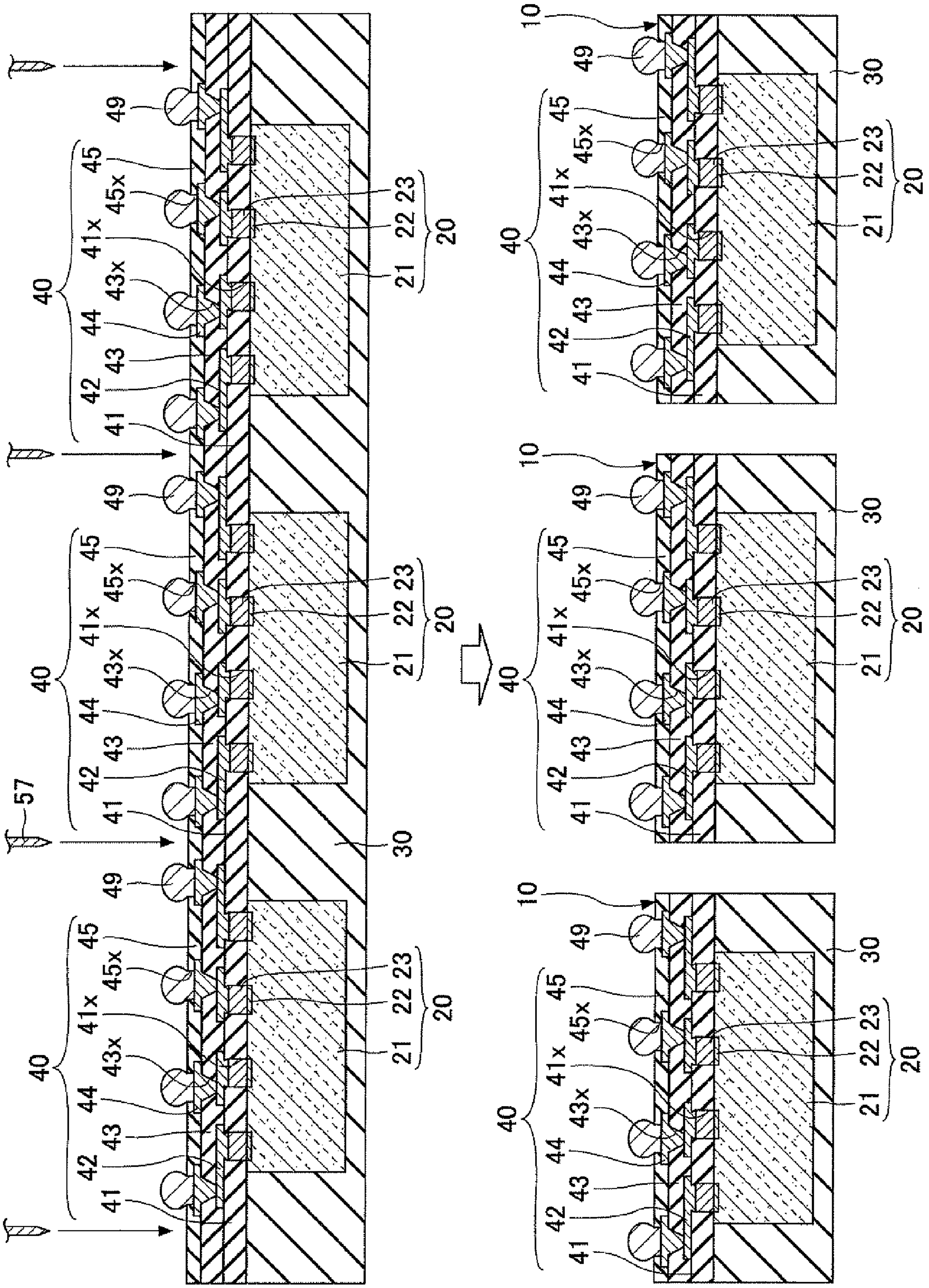
FIG. 18 is a fourteenth view showing the example of the manufacturing process of the semiconductor package of the first embodiment of the present invention.

Next, in a step illustrated in FIG. 18, the structural body illustrated in FIG. 17 is cut in designated positions so as to make pieces of the structural body, and thereby the semiconductor package 10 is completed. Cutting of the structural body illustrated in FIG. 18 can be performed by dicing using a dicing blade 57 or the like.

Thus, according to the first embodiment, the semi-cured state (B-stage state) insulation layer made of a photosensitive material is formed on the supporting body. The openings exposing the supporting body are formed in the insulation layer by the photolithography method. The semiconductor chip is mounted on the insulation layer so that the positions of the projecting electrodes of the semiconductor chip are consistent with the opening parts of the insulation layer, and then the insulation layer is cured. After that, the sealing resin configured to seal the semiconductor chip is formed on the semiconductor chip side surface of the insulation layer, and then the supporting body is removed. In addition, the wiring layer is provided on the surface of the insulation layer opposite to the side facing the semiconductor chip. The wiring layer is configured to be electrically connected to the projecting electrodes exposed in the opening parts of the insulation later. As a result of this, the wiring structural body including the insulation layer and the wiring layer is formed. As discussed above, the semiconductor chip and the wiring structural body are directly connected to each other without using the solder bumps or the like. Therefore, it is not necessary to raise the temperature of the semiconductor chip and the wiring structural body to, for example, a temperature equal to or higher than approximately 200° C. at which the solder bump or the like is made molten. As a result of this, warping or winding of the wiring structural body due to the difference of coefficients of thermal expansion between the semiconductor chip and the wiring structural body can be reduced. Accordingly, it is possible to reduce positional shift generated between the semiconductor chip and the wiring structural body. Hence, it is possible to improve the connection reliability between the semiconductor chip and the wiring structural body.

Since the semiconductor chip and the wiring structural body are directly connected to each other without using the solder bumps or the like, it is not necessary to apply the flux. Hence, insulation failure due to the residual of the flux can be prevented and therefore the connecting reliability between the semiconductor chip and the wiring structural body can be improved.

In addition, the semiconductor chip is mounted on the insulation layer so that the positions of the projecting electrodes of the semiconductor chip correspond to the opening parts of the insulation layer, and the insulation layer is cured. Therefore, it is not necessary to provide a step of supplying the underfill resin between the semiconductor chip and the insulation layer. Accordingly, in the semiconductor package of the first embodiment, unlike the related art semiconductor package, voids may not be generated.

Furthermore, since the opening parts of the insulation layer are formed by a photolithography method, it is possible to improve the precision of the forming positions of the opening parts.

Modified Example of the First Embodiment

Figure 20:
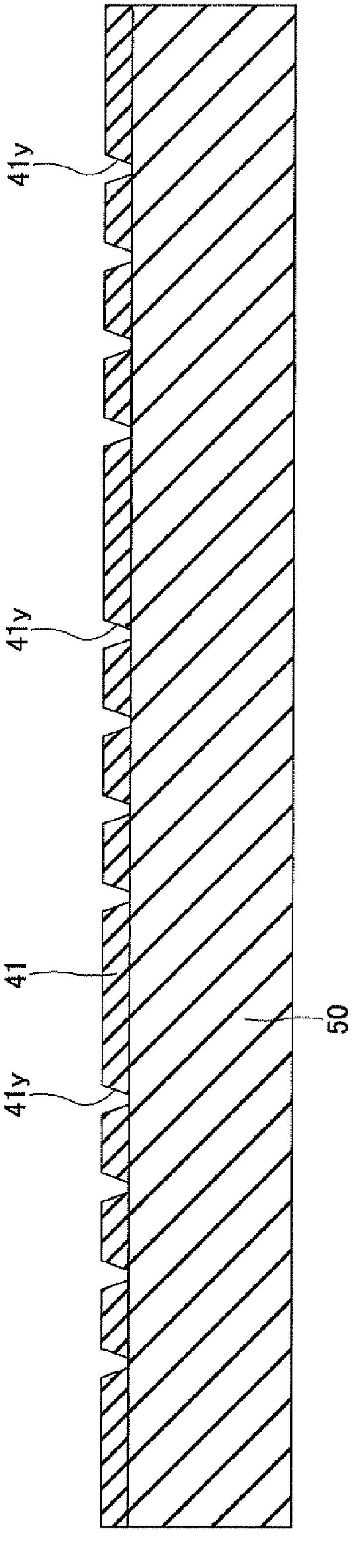
FIG. 20 is a first view showing an example of a manufacturing process of the semiconductor package of the modified example of the first embodiment of the present invention.
Figure 21:
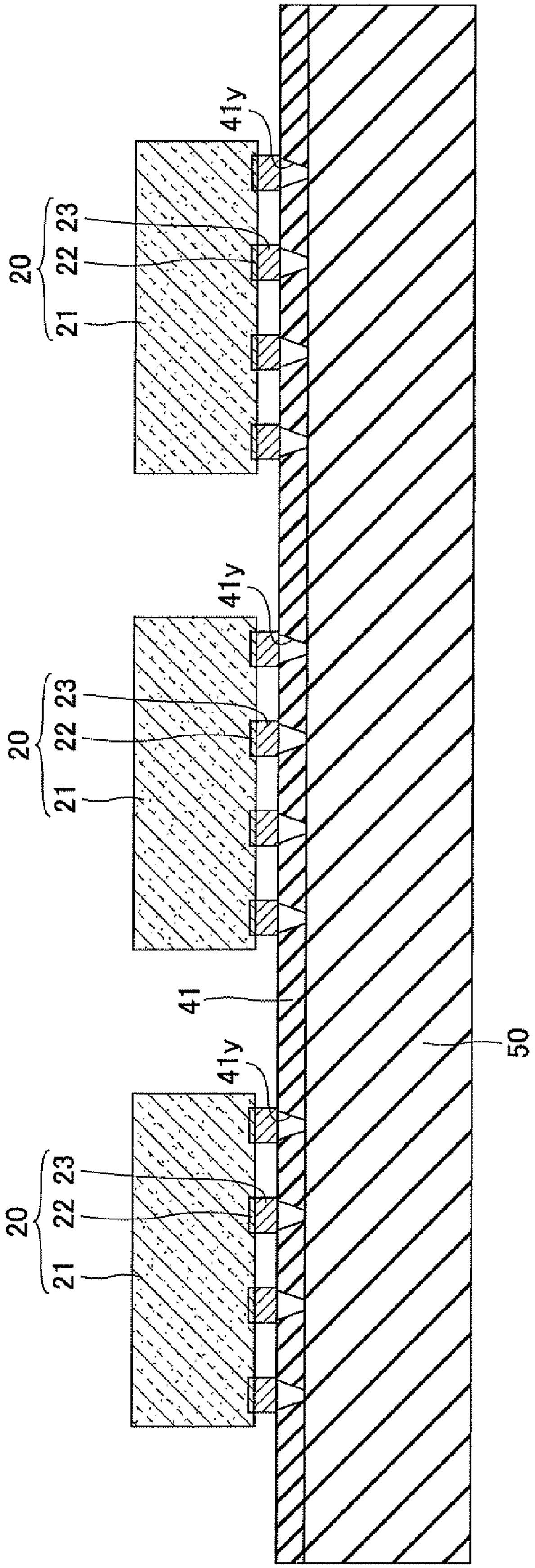
FIG. 21 is a second view showing the example of the manufacturing process of the semiconductor package of the modified example of the first embodiment of the present invention.

In a modified example of the first embodiment, a manufacturing method of a semiconductor package illustrated in FIG. 20 and FIG. 21 in which the steps illustrated in FIG. 20 and FIG. 21 are replacements is discussed.

[Structure of a Semiconductor Package of the Modified Example of the First Embodiment]

Figure 19:
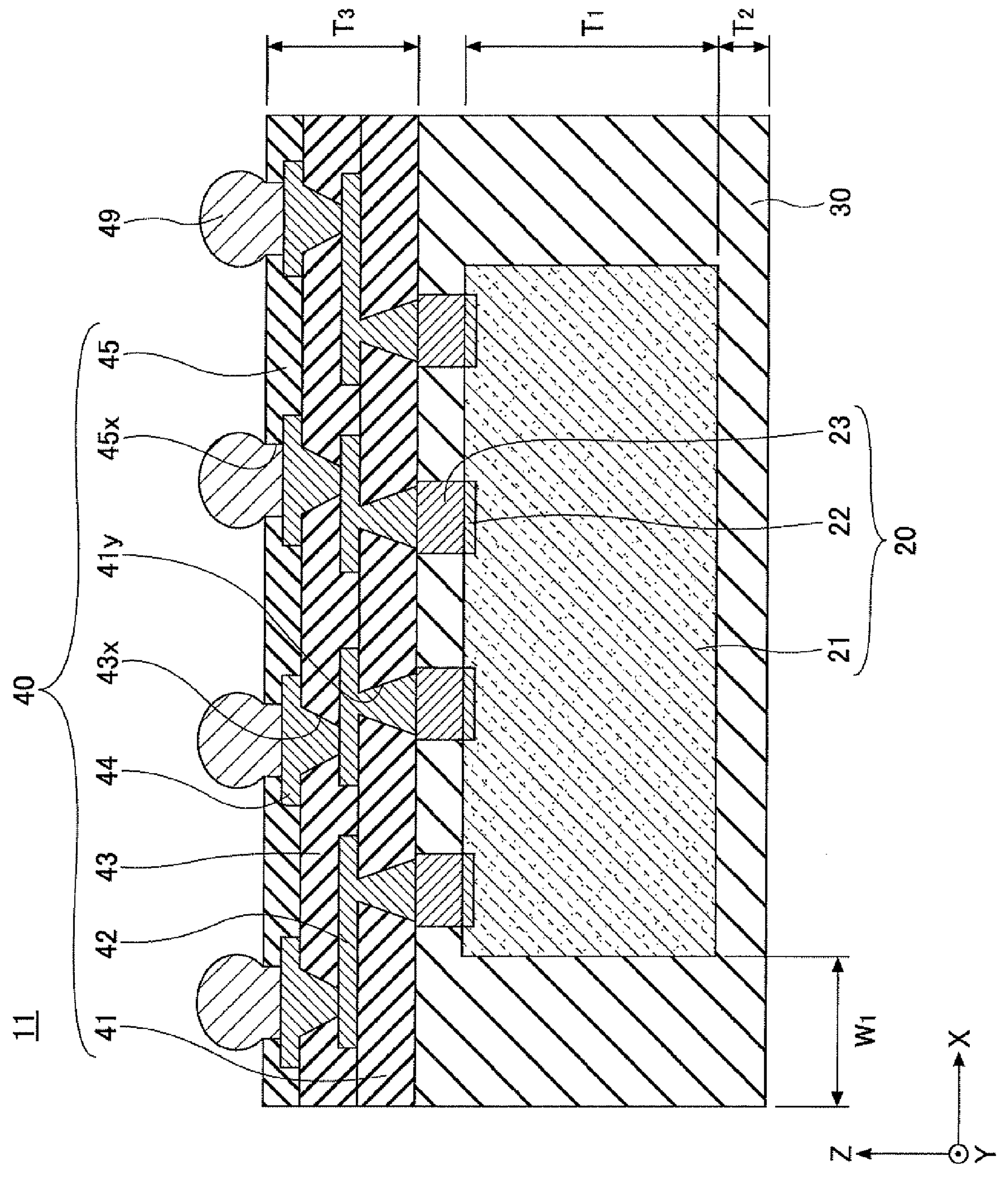
FIG. 19 is a cross-sectional view of an example of a semiconductor package of a modified example of the first embodiment of the present invention.

FIG. 19 is a cross-sectional view of an example of a semiconductor package of a modified example of the first embodiment of the present invention. In FIG. 19, parts that are the same as the parts shown in FIG. 4 are given the same reference numerals, and explanation thereof is omitted.

As shown in FIG. 19, a semiconductor package 11 is different from the semiconductor package 10 in that a main surface of the semiconductor chip 20 and the first insulation layer 41 do not come in contact with each other and the sealing resin 30 is formed between the surface of the semiconductor chip 20 and the first insulation layer 41. In the semiconductor package 11, parts that are the same as the parts of the semiconductor package 10 are given the same reference numerals, and explanation thereof is omitted.

As shown in FIG. 19, in the semiconductor package 11, since the main surface side of the semiconductor chip 20 is sealed by the sealing resin 30, it is possible to more properly protect the semiconductor chip 20.

In addition, filler such as silica is contained in the sealing resin 30, so that the coefficient of thermal expansion of the sealing resin 30 can be close to that of the semiconductor chip 20 and the strength or the sealing capabilities of the sealing resin 30 can be improved. Because of this, generally, if the wiring layer is formed on the sealing resin 30 by plating, adhesion between the sealing resin 30 and the wiring layer formed by plating may be degraded. However, in this example, the first wiring layer 42 is formed on the sealing resin 30 via the first insulation layer 41. Therefore, a problem of the adhesion between the first wiring layer 42 and the sealing resin 30 is not generated.

The projecting electrodes 23 may be made higher such as approximately 30 μm through approximately 50 μm so that filling by the sealing resin 30 is improved and the sealing properties of the sealing resin 30 at the main surface side of the semiconductor chip 20 are improved.

[Manufacturing Method of the Semiconductor Package of the Modified Example of the First Embodiment]

FIG. 20 and FIG. 21 are first and second views showing an example of a manufacturing process of the semiconductor package of the modified example of the first embodiment of the present invention. In FIG. 20 and FIG. 21, parts that are the same as the parts shown in FIG. 7 and FIG. 9 are given the same reference numerals, and explanation thereof is omitted.

First, the same steps as the first embodiment illustrated in FIG. 5 and FIG. 6 are performed. Next, in a step illustrated in FIG. 20, by a photolithography method, opening parts 41*y* are formed in the first insulation layer 41 so as to expose one of the surfaces of the supporting body 50. The opening parts 41*y* are formed in positions of the projecting electrodes 23 of the semiconductor chip 20 to be mounted in a step illustrated in FIG. 21. The opening parts 41*y* have, for example, a cone frustum-shaped configuration where a diameter at the supporting body 50 side is small. A diameter of a largest portion of the opening part 41*y* is smaller than a diameter of the projecting electrode 23 of the semiconductor chip 20. In this step, the first insulation layer 41 remains not completely cured but semi-cured.

Next, in a step illustrated in FIG. 21, a designated number of the semiconductor chips 20 illustrated in FIG. 8 and having the electrode pads 22 and the projecting electrodes 23 is prepared and mounted on the first insulation layer 41. More specifically, positions of the opening parts 41*y* of the first insulation layer 41 and the projecting electrodes 23 of the semiconductor chip 20 are aligned and the semiconductor chips 20 are provided on the first insulation layer 41. Then, by heating the first insulation layer at, for example, approximately 80° C., the semiconductor chips 20 are provisionally fixed onto the first insulation layer 41. Then, by heating the first insulation layer 41 at a curing temperature such as approximately 170° C., the first insulation layer 41 is completely cured. In this case, since the diameter of the largest portion of the opening parts 41*y* is smaller than the diameter of the projecting electrodes 23 of the semiconductor chip 20, the projecting electrodes 23 of the semiconductor chip 20 are not inserted in the opening parts 41*x* of the first insulation layer 41 but provided on the first insulation layer 41. By this step, head surfaces of the projecting electrodes 23 of the semiconductor chip 20 are adhered to a surface of the first insulation layer 41 in the periphery edge of the opening parts 41*y*.

Next, the same steps as the first embodiment illustrated in FIG. 10 through FIG. 18 are performed, so that the semiconductor package 11 illustrated in FIG. 19 is completed. The opening parts 41*y* are finally filled with the material of the first wiring layer 42.

Thus, according to the modified example of the first embodiment, the following effect in addition to the effect of the first embodiment can be achieved. That is to say, since the main surface side of the semiconductor chip is also sealed by the sealing resin, the semiconductor chip can be more properly protected. In addition, since the first wiring layer is formed on the sealing resin via the first insulation layer, it is possible to avoid the problem of the adhesion between the first wiring layer and the sealing resin. As discussed above, the diameter of the largest portion of the opening parts of the insulation layer may be greater or smaller than the diameter of the projecting electrodes of the semiconductor chip.

Second Embodiment

In a second embodiment of the present invention, a manufacturing method of the semiconductor package where an order of steps of the first embodiment is changed is discussed.

[Manufacturing Method of the Semiconductor Package of the Second Embodiment]

Figure 22:
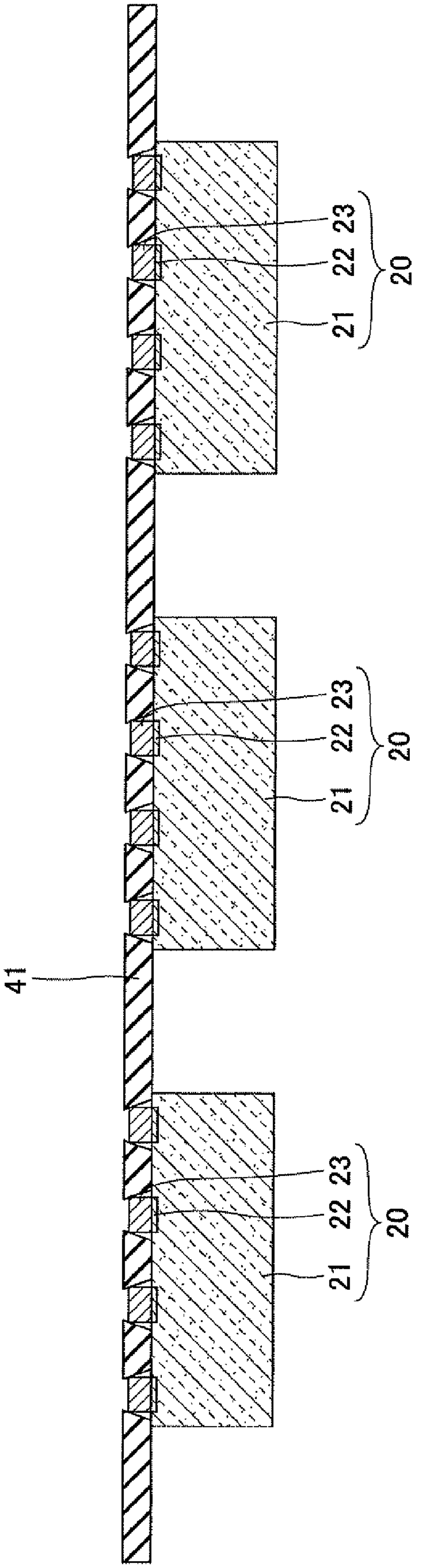
FIG. 22 is a first view showing an example of a manufacturing process of a semiconductor package of a second embodiment of the present invention.
Figure 23:
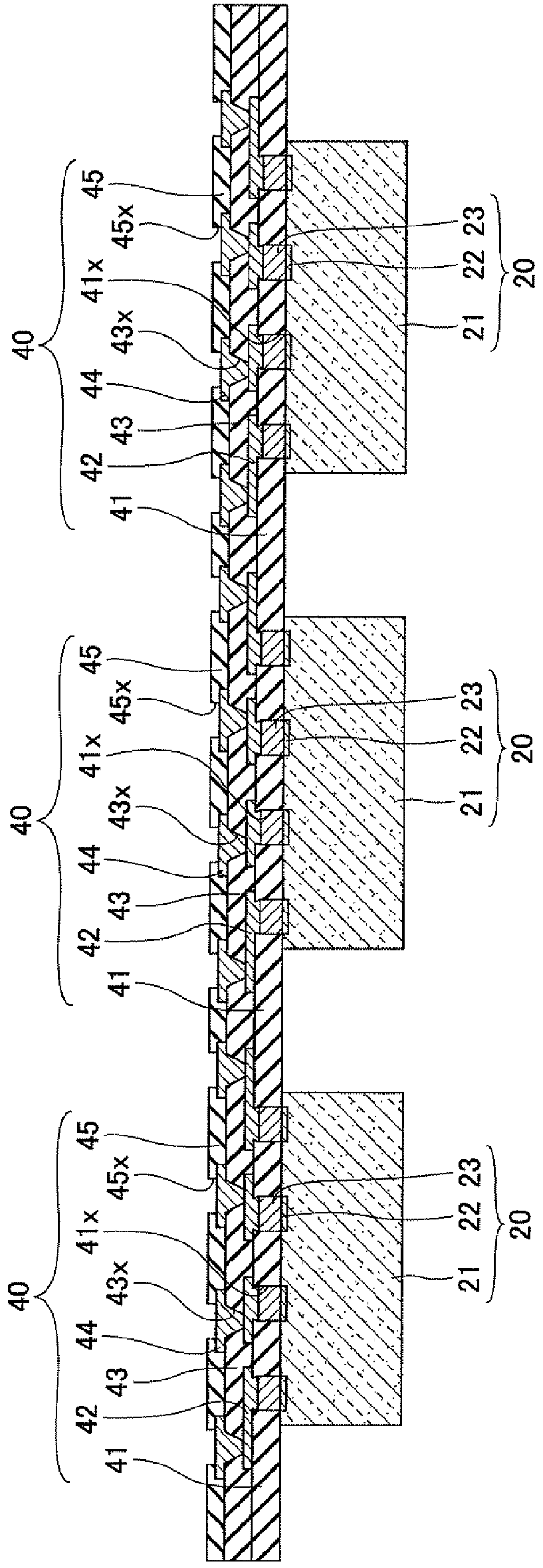
FIG. 23 is a second view showing the example of the manufacturing process of the semiconductor package of the second embodiment of the present invention.
Figure 24:
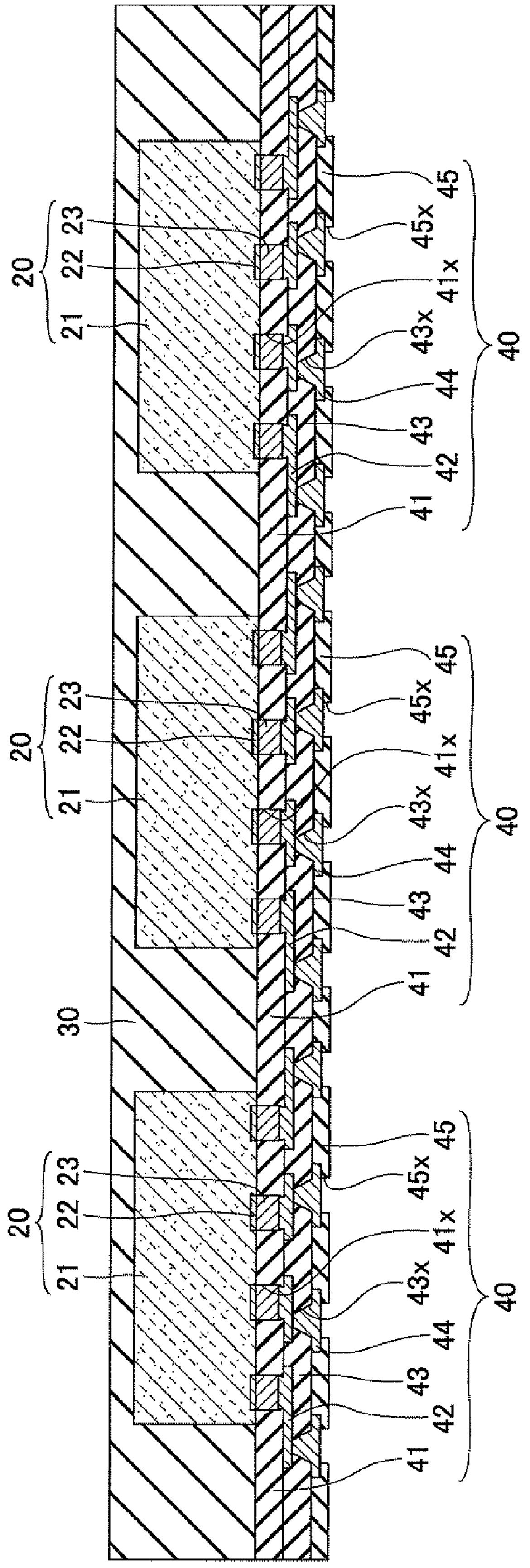
FIG. 24 is a third view showing the example of the manufacturing process of the semiconductor package of the second embodiment of the present invention.

FIG. 22 through FIG. 24 are first through third views showing an example of a manufacturing process of a semiconductor package of the second embodiment of the present invention. In FIG. 22 through FIG. 24, parts that are the same as the parts shown in FIGS. 5 through 18 are given the same reference numerals, and explanation thereof is omitted.

First, the same steps as the first embodiment illustrated in FIG. 5 through FIG. 9 are performed. Next, in a step illustrated in FIG. 22, the supporting body 50 illustrated in FIG. 9 is removed. FIG. 22 is an upside down view relative to FIG. 9. In a case where the supporting body 50 is a copper (Cu) plate, the supporting body 50 can be removed by etching using, for example, a ferric chloride aqueous solution. In a case where the supporting body 50 is a plate made of silicon, ceramics, glass, or the like, a pressure-sensitive adhesive double-coated tape is adhered on the one of the surfaces of the supporting body 50 and then the first insulation layer 41 may be formed on the surface of the supporting body 50 via the tape. In this case, the supporting body 50 can be removed by heating at a temperature where the adhesion of the pressure-sensitive adhesive double-coated tape is decreased.

Next, in a step illustrated in FIG. 23, the same steps as the first embodiment illustrated in FIG. 12 through FIG. 16 are performed. Then, in a step illustrated in FIG. 24, the sealing resin 30 is formed on the first insulation layer 41 so as to cover the semiconductor chips 20. FIG. 24 is an upside down view relative to FIG. 23. As a material of the sealing resin 30, for example, epoxy group resin, polyimide resin, or the like can be used. Since the sealing resin 30 is a part of a base body of the semiconductor package 10, a resin material having good hardness or strength rather than uniform thickness or processing easiness may be used. The sealing resin 30 can be formed by, for example, a transfer molding method.

Next, the same steps as the first embodiment illustrated in FIG. 17 and FIG. 18 are performed, so that the semiconductor package 10 illustrated in FIG. 4 is completed.

Thus, according to the second example, the following effect in addition to the effect of the first embodiment can be achieved. That is, since the periphery of the semiconductor chip is sealed by the sealing resin after the wiring structural body is formed on the semiconductor chip, it is possible to prevent stress from being applied to the wiring structural body due to the difference of the coefficients of thermal expansion between the semiconductor chip and the sealing resin.

In addition, since the periphery of the semiconductor chip is sealed by the sealing resin after the semiconductor chip and the wiring structural body are connected to each other, it is possible to prevent the position of the semiconductor chip from being shifted at the time of sealing.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

For example, in the semiconductor chip 20, it is not necessary to form the projecting electrodes 23 on the electrode pads 22. In this case, in the step illustrated in FIG. 12, the first wiring layer 42 is electrically connected to the electrode pads 22 exposed in the opening parts 41*x*.

In addition, in order to improve heat radiating capabilities of the semiconductor package 10 or 11 or make the semiconductor package 10 or 11 thinner, the sealing resin 30 at the rear surface side of the semiconductor chip 20 may be ground so that the rear surface of the semiconductor chip 20 may be exposed. In this case, grinding the sealing resin 30 can be applied at an interval between the step illustrated in FIG. 10 and the step illustrated in FIG. 11 or an interval between the step illustrated in FIG. 16 and the step illustrated in FIG. 17.

What is claimed is:

1. A manufacturing method of a semiconductor package, comprising:

forming a semi-cured insulation layer made of a photosensitive material on a supporting body;

forming an opening part in the insulation layer by a photolithography method, the opening part being configured to expose the supporting body;

arranging a semiconductor chip on the insulation layer so that a position of an electrode of the semiconductor chip is consistent with a position of the opening part, and curing the insulation layer;

forming sealing resin on a surface of the insulation layer at a side of the insulation layer with the semiconductor chip, the sealing resin being configured to seal the semiconductor chip;

removing the supporting body; and subsequent to the steps of forming a semi-cured insulation layer and removing the supporting body, providing a wiring layer on a surface of the insulation layer opposite to the side of the insulation layer with the semiconductor chip; and electrically connecting the wiring layer to the electrode exposed in the opening part, thereby forming a wiring structural body including the insulation layer and the wiring layer.

2. The manufacturing method of the semiconductor package as claimed in claim 1, wherein the photosensitive material is a film; and forming the insulation layer by laminating the photosensitive film in a vacuum environment.

3. The manufacturing method of the semiconductor package as claimed in claim 1, wherein the photosensitive material is a paste or a liquid; and the insulation layer is formed by applying the paste or the liquid photosensitive material.

4. The manufacturing method of the semiconductor package as claimed in claim 1, wherein a main ingredient of the photosensitive material is at least one of acrylic, epoxy, and polyimide.

5. The manufacturing method of the semiconductor package as claimed in claim 1, forming the wiring layer by a method including at least one of an electroless plating method, a sputtering method, a vapor deposition method, and an electrolytic plating method.

6. The manufacturing method of the semiconductor package as claimed in claim 1, further comprising:

forming a solder resist layer having an opening part, the opening part being configured to expose a part of the wiring layer.

7. The manufacturing method of the semiconductor package as claimed in claim 6, further comprising:

forming an external connection terminal on the wiring layer exposed in the opening part of the solder resist layer.

8. The manufacturing method of the semiconductor package as claimed in claim 7, wherein the external connection terminal is formed in a region outside the semiconductor chip in a planar view.

9. The manufacturing method of the semiconductor package as claimed in claim 8, wherein a pitch of neighboring of the external connection terminals is greater than a pitch of a neighboring plurality of electrodes.

10. The manufacturing method of the semiconductor package as claimed in claim 1, further comprising:

placing a plurality of semiconductor chips on the insulation layer;

after forming the wiring layer, cutting the structural body into pieces at positions between the plurality of semiconductor chips, thereby obtaining multiple semiconductor packages.

* * * * *